United States Patent
Madrigal et al.

(10) Patent No.: US 11,038,768 B1
(45) Date of Patent: Jun. 15, 2021

(54) METHOD AND SYSTEM FOR CORRELATION OF A BEHAVIORAL MODEL TO A CIRCUIT REALIZATION FOR A COMMUNICATIONS SYSTEM

(71) Applicant: Xilinx, Inc., San Jose, CA (US)

(72) Inventors: Ivan O. Madrigal, San Jose, CA (US); Michael O. Jenkins, San Jose, CA (US); Hong S. Ahn, San Jose, CA (US); Murtuza Z. Cutleriwala, San Jose, CA (US); Alan C. Wong, San Jose, CA (US); Christopher J. Borrelli, Los Gatos, CA (US); Yohan Frans, Palo Alto, CA (US); Geoffrey Zhang, San Jose, CA (US); Hongtao Zhang, San Jose, CA (US)

(73) Assignee: XILINX, INC., San Jose, CA (US)

(*) Notice: Subject to any disclaimer, the term of this patent is extended or adjusted under 35 U.S.C. 154(b) by 482 days.

(21) Appl. No.: 15/267,002

(22) Filed: Sep. 15, 2016

(51) Int. Cl.
*H04L 25/03* (2006.01)
*H04L 12/24* (2006.01)
*G06F 30/331* (2020.01)

(52) U.S. Cl.
CPC .......... *H04L 41/145* (2013.01); *G06F 30/331* (2020.01); *H04L 25/03057* (2013.01)

(58) Field of Classification Search
CPC ............. H04L 41/145; H04L 25/03057; G06F 17/5027; G06F 30/331
USPC .................................. 703/13, 14, 20, 23, 25
See application file for complete search history.

(56) References Cited

U.S. PATENT DOCUMENTS

| 5,500,879 A | * | 3/1996 | Webster | H04B 3/23 375/257 |
| 6,182,258 B1 | * | 1/2001 | Hollander | G01R 31/31704 714/739 |
| 7,792,933 B2 | * | 9/2010 | Butts | G06F 17/5022 709/222 |
| 7,882,484 B1 | | 2/2011 | Baldwin et al. | |
| 8,196,075 B1 | | 6/2012 | Garrault et al. | |

(Continued)

OTHER PUBLICATIONS

Fritsch et al., "Speeding Up Simulation by Emulation—A Case Study", 1999, Proceedings User's Forum. vol. 127, pp. 127-134.*

(Continued)

*Primary Examiner* — Juan C Ochoa
(74) *Attorney, Agent, or Firm* — Patterson + Sheridan, LLP

(57) ABSTRACT

A method relates generally to comparison of a communications system modelled with a behavioral model and implemented with a circuit realization. In this method, operation of the communications system is simulated with the behavioral model on a computing device to obtain a first pulse response. The simulating includes first equalizing first data with a first equalizer of the behavioral model to obtain the first pulse response. The circuit realization is operated to obtain a second pulse response. The operating includes: second equalizing second data corresponding to the first data with a second equalizer of the circuit realization to obtain the second pulse response. The second pulse response from the circuit realization is loaded to memory of the computing device. The first pulse is loaded to the memory of the computing device. The first pulse response and the second pulse response are compared with one another by the computing device.

20 Claims, 15 Drawing Sheets

(56) References Cited

U.S. PATENT DOCUMENTS

| | | | | |
|---|---|---|---|---|
| 8,452,582 B1* | 5/2013 | Al-Hawari | G06F 17/5036 | 703/13 |
| 8,560,294 B1* | 10/2013 | Ren | G06F 17/5036 | 703/14 |
| 8,656,329 B1* | 2/2014 | Kukal | G06F 17/5036 | 716/108 |
| 8,831,084 B1* | 9/2014 | Liu | H04L 25/03885 | 375/233 |
| 8,913,688 B1 | 12/2014 | Jenkins | | |
| 8,923,463 B1 | 12/2014 | Jenkins et al. | | |
| 9,026,966 B1* | 5/2015 | Ramachandran | G06F 30/398 | 716/108 |
| 9,798,848 B1* | 10/2017 | Keshavan | G06F 17/5081 | |
| 9,928,318 B1* | 3/2018 | Kukal | G06F 17/5022 | |
| 2004/0059562 A1* | 3/2004 | Bergman | G06F 9/455 | 703/23 |
| 2004/0098242 A1* | 5/2004 | Moona | G06F 11/3447 | 703/22 |
| 2004/0148153 A1* | 7/2004 | Beletsky | G06F 17/5027 | 703/27 |
| 2005/0131664 A1* | 6/2005 | Chen | G06F 17/5022 | 703/13 |
| 2005/0144585 A1* | 6/2005 | Daw | G06F 30/331 | 716/104 |
| 2005/0267727 A1* | 12/2005 | Poplack | H04L 43/50 | 703/25 |
| 2008/0306721 A1* | 12/2008 | Yang | G06F 11/261 | 703/14 |
| 2009/0262792 A1* | 10/2009 | Huang | H04L 25/03006 | 375/224 |
| 2015/0121347 A1* | 4/2015 | Petit | G06F 30/20 | 717/126 |
| 2015/0127877 A1* | 5/2015 | Novellini | G06F 13/4282 | 710/316 |
| 2015/0311899 A1 | 10/2015 | Karras et al. | | |
| 2016/0063171 A1* | 3/2016 | Tripathi | G05B 19/418 | 716/136 |
| 2016/0253446 A1* | 9/2016 | Chong | G06F 17/5036 | 716/136 |
| 2018/0107775 A1* | 4/2018 | Xu | G06F 17/5036 | |

OTHER PUBLICATIONS

Andrew S. Tanenbaum, "Structured Computer Organization", © 1984, pp. 10-12.*

Palermo, Sam, "ECEN689: Special Topics in High-Speed Links Circuits and Systems," Lecture 18: X FIR & CTLE Equalization, Texas A & M University, Analog & Mixed-Signal Center, Jan. 1, 2010, pp. 1-16, Texas A & M Jniversity, College Station, Texas, USA.

Sullivan, Bob et al., "Simulating High-Speed Serial Channels with IBIS-AMI Models," Aug. 1, 2014, pp. 1-19, Keysight Technologies, Santa Clara, California, USA.

Bielich, Luis, "In-System Eye Scan of a PCI Express Link with Vivado IP Integrator and AXI4," XAPP1191 (v1.1), Nov. 19, 2014, pp. 1-29, Xilinx, Inc., San Jose, California, USA.

Jenkins, Michael et al., "Acquisition & Analysis of High-Speed Serial Statistical Eyes at the Sampling Point in a Receiver," Proc. of DesignCon 2013, Jan. 29, 2013, pp. 1-10.

* cited by examiner

METHOD AND SYSTEM FOR CORRELATION OF A BEHAVIORAL MODEL TO A CIRCUIT REALIZATION FOR A COMMUNICATIONS SYSTEM

TECHNICAL FIELD

The following description relates to integrated circuit devices ("ICs"). More particularly, the following description relates to method and system for correlation of a behavioral model to a circuit realization for a communications system.

BACKGROUND

An Input/Output Buffer Information Specification ("IBIS") is a well-known simulation tool, with IBIS models being used to simulate serial interfaces. However, as serial interface bit rates have increased leading to more analog behavioral in signal propagation, an IBIS-Algorithmic Modeling Interface ("IBIS-AMI") was developed for mixed signal behavioral modeling. A basic IBIS-AMI output-to-input buffer model for communicating between two packaged components is well known. However, IBIS-AMI models have some inherent limitations. Along those lines, correlation between IBIS-AMI models and actual products associated therewith has been lacking for signal integrity analysis with respect to high-speed communication systems.

Hence, it is desirable to provide for better correlation.

SUMMARY

A method relates generally to comparison of a communications system modelled with a behavioral model and implemented with a circuit realization. In such a method, operation of the communications system is simulated with the behavioral model on a computing device to obtain a first pulse response. The simulating includes: first equalizing first data with a first equalizer on a receiver side of the behavioral model; and obtaining the first pulse response after the first equalizing. The circuit realization of the communications system is operated to obtain a second pulse response. The operating includes: second equalizing second data corresponding to the first data with a second equalizer on a receiver side of the circuit realization; and obtaining the second pulse response after the second equalizing. The second pulse response from the circuit realization is loaded to memory of the computing device. The first pulse is loaded to the memory of the computing device. The first pulse response and the second pulse response are compared with one another by the computing device. Results from the comparing are stored for adjustment of the behavioral model.

A system relates generally to comparison of a communications system modelled with a behavioral model and implemented with a circuit realization. In such a system, the communications system modelled with a behavioral model is on a computing device. A first equalizer on a receiver side of the behavioral model is configured for first equalization of first data to obtain a first pulse response. The circuit realization of the communications system is coupled for communication with the computing device. A second equalizer on a receiver side of the circuit realization is configured for second equalization of second data corresponding to the first data to obtain a second pulse response. The computing device is configured to receive the second pulse response and to compare the first pulse response and the second pulse response with one another.

A tangible computer readable storage medium relates generally to storing one or more programs. The one or more programs including instructions, which when executed by a computing device with one or more processors and memory, cause the computing device to execute the instructions. In such medium, the computing device causes simulated operation of a communications system modelled with a behavioral model to obtain a first pulse response. The simulated operation includes first equalization, by an equalizer model of the behavioral model, of first data received on a receiver side of the behavioral model to obtain the first pulse response after the first equalization. The computing device causes a second pulse response to be obtained for second data corresponding to the first data. The second pulse response is associated with a second equalization on a receiver side of a circuit realization of the communications system. The computing device causes the first pulse response and the second pulse response to be compared with one another.

Other features will be recognized from consideration of the Detailed Description and Claims, which follow.

BRIEF DESCRIPTION OF THE DRAWINGS

Accompanying drawings show exemplary apparatus(es) and/or method(s). However, the accompanying drawings should not be taken to limit the scope of the claims, but are for explanation and understanding only.

DETAILED DESCRIPTION

Figure 1:
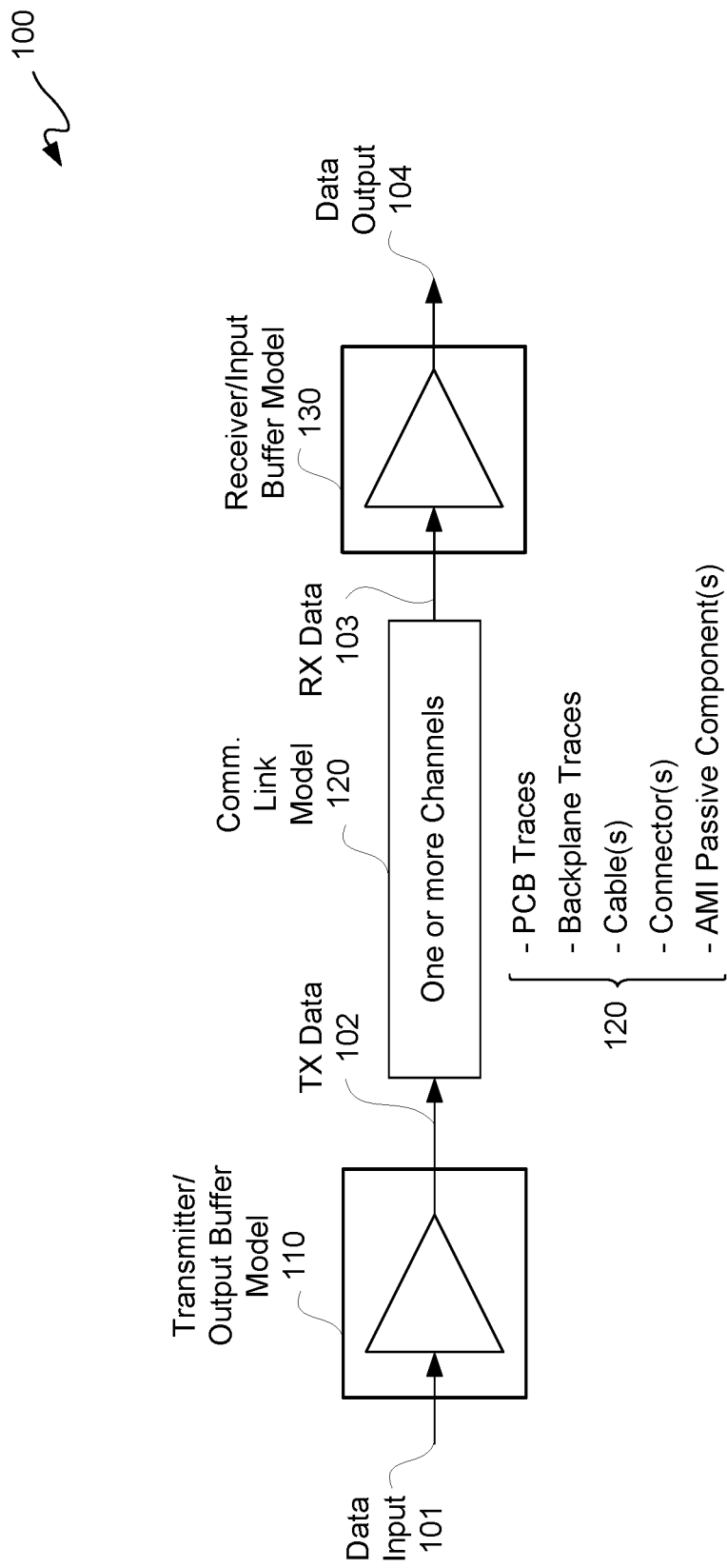
FIG. 1 is a block diagram depicting an exemplary communications system behavioral model ("behavioral model").

In the following description, numerous specific details are set forth to provide a more thorough description of the specific examples described herein. It should be apparent, however, to one skilled in the art, that one or more other examples and/or variations of these examples may be practiced without all the specific details given below. In other instances, well known features have not been described in detail so as not to obscure the description of the examples herein. For ease of illustration, the same number labels are used in different diagrams to refer to the same items; however, in alternative examples the items may be different.

Exemplary apparatus(es) and/or method(s) are described herein. It should be understood that the word "exemplary" is used herein to mean "serving as an example, instance, or illustration." Any example or feature described herein as "exemplary" is not necessarily to be construed as preferred or advantageous over other examples or features.

Some portions of the detailed descriptions that follow are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those involving physical manipulations of physical quantities. Usually, though not necessarily, these quantities take the form of optical, electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussion, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Before describing the examples illustratively depicted in the several figures, a general introduction is provided to further understanding.

As bandwidth of digital transmission rapidly increases, high-speed communication systems (i.e., 20 gigabits per second ("Gbps") and greater), get more elaborate to comply with signal integrity demand. System designers incorporating high-speed communication links face significant challenges with respect to: high data rates, constant channel lengths, signal quality deterioration, and serializer-deserializer ("SerDes") transceiver performance. Due to its complex nature, a design flow of such high-speed communication links significantly relies on simulation to evaluate a communication system to anticipate signal integrity and/or other flaws in a design.

IBIS-AMI has emerged as an industry standard to perform high-speed SerDes communication link simulations for fast, secure, and/or portable transceiver models. A problem with IBIS-AMI or any other type of behavioral model is capturing in such models the actual behavior of an integrated circuit chip during operation.

To enhance correlation between a behavioral model, such as IBIS-AMI or the like, and actual behavior of an integrated circuit chip, a hardware correlation methodology is described that employs a non-destructive mechanism to capture a pulse response at an output of a receiver equalizer, such as a decision feedback equalizer ("DFE") or the like, to effectively model and validate behavior of IBIS-AMI transceiver models with actual behavior of a communication system implemented with one or more integrated circuit chips. By comparing actual hardware behavior to a simulation waveform for such hardware, such as by analyzing and observing a post-equalizer pulse response of a receiver in hardware as compared with a simulated pulse response for same, accuracy of a behavioral model, such as an IBIS-AMI model or the like, may be increased.

With the above general understanding borne in mind, various configurations for analysis and correlation between a behavioral model and a circuit realization of a communications system are generally described below.

FIG. 1 is a block diagram depicting an exemplary communications system behavioral model ("behavioral model") 100. Though the following description is in terms of IBIS-AMI model, the following description is likewise applicable to other types of behavioral models of communications systems. For example, such other types of models may include IBIS, VHDL-AMS, Verilog-A, and I/O SPICE models, among others.

Behavioral model 100 may include a transmitter/output buffer model ("transmitter model") 110, an end-to-end communication link model ("communication link model") 120, and a receiver/input buffer model ("receiver model") 130. Simulated data input 101 may be data provided to transmitter model 110 to provide simulated transmitted data ("TX data") 102 to communication link model 120. Use of Electronic Design Automation ("EDA") tools for generation of circuit models is well known. Generation of models of circuits is described for example in U.S. Pat. Nos. 8,560,294, 8,196,075, and 7,882,484 all of which are commonly owned by the assignee hereof.

Communication link model 120 may model one or more channels. Some examples of hardwired communication links that may be modelled as a communication link model 120 include a PCB, a backplane, cable(s), connector(s), and/or an AMI passive component, among other hardwired communication links that may be simulated.

Passing simulated data through communication link model 120 may affect simulated TX data 102 resulting in simulated received data ("RX data") 103. RX data 103 may be received by receiver model 130 for providing simulated data output 104. In a circuit realization, transmitter/output buffer 110 and receiver/input buffer 130 may be implemented in respective integrated circuits or may be implemented in a same integrated circuit as a transmitter and a receiver or as a transceiver. For purposes of clarity by way of example and not limitation, it shall be assumed that a single field programmable gate array ("FPGA") having multiple transceivers is mounted to a PCB to provide a communication link, where such FPGA is used in a loop back mode. However, it shall be apparent that separate chips mounted on separate PCBs or a same backplane or another configuration may be used for a circuit realization of a communications system corresponding to behavioral model 100.

An IBIS-AMI model design may represent multiple boundaries or boundary conditions of a communications system, such as for example a best case, a worst case, and a typical or normal case. Along those lines, IBIS-AMI models covering three different process-voltage-temperature ("PVT") conditions or "corners" for a transmitter model 110, a communication link model 120 and a receiver model 130 may be used for behavioral model 100. For purposes of clarity by way of example and not limitation, it shall be assumed that behavioral model 100 is for a SerDes link system ("SerDes system") 100.

By simulating various PVT combinations for components of a SerDes system 100, best and worst case simulated outcomes may be obtained, along with outcomes in-between. By comparing simulated pulse response outcomes with corresponding actual circuit realization pulse response outcomes for a communications system, behavioral models of a communications system library may be enhanced. Continuing the above-example of an FPGA and associated software tools for simulating and analyzing a design, a SerDes system designer may obtain a high level of confidence of a representation of physical behavior of a SerDes link system prior to hardware testing. In short, enhanced verification tools may result in more accurate reports for shortening time for design-to-implementation closure. While generally a design may be a C-based or hardware description language-based ("HDL-based") design, the following description is not limited to any particular design language.

Along those lines, a pulse response may be used as a quantitative way to understand and analyze a transfer function of a SerDes link or other serial communications system link. Though a behavioral model may use mathematical descriptions of operation, such as a transfer function for example, these mathematical descriptions are for describing physical operation of actual devices. Thus, a design and associated design constraints may represent an actual clock path, data path, interconnects, logic, and/or other portions of a product to be implemented as a circuit realization, whether in one or more chips, such as DSPs, FPGAs, ASICs, ASSPs, and/or other integrated circuits.

Figure 2:
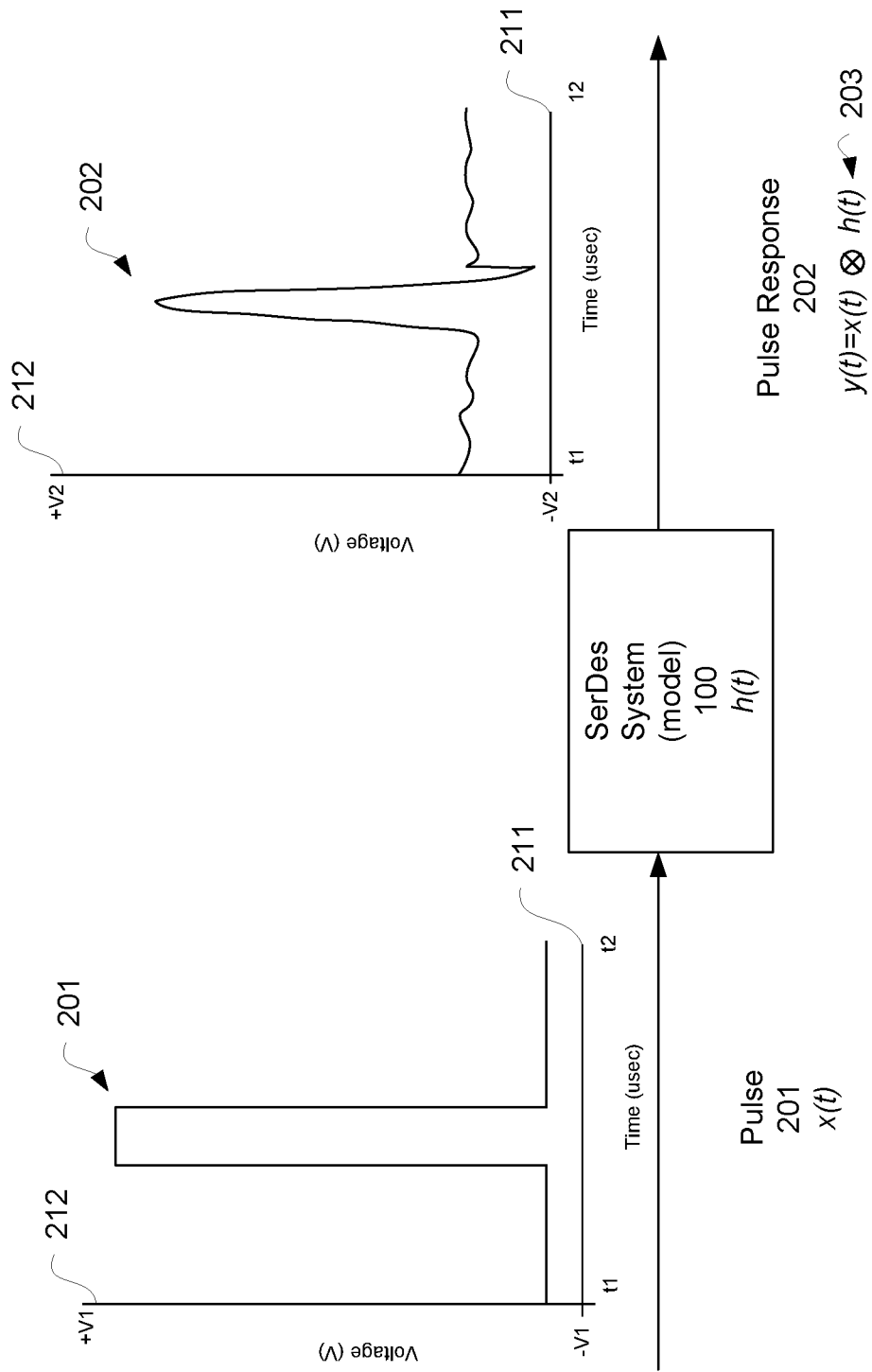
FIG. 2 is a block/signal diagram depicting an exemplary modelling of operation of a serializer-deserializer ("SerDes") communications system for the behavioral model ("SerDes system") of FIG. 1.

FIG. 2 is a block/signal diagram depicting an exemplary modelling of operation of a SerDes communications system for behavioral model 100 ("SerDes system 100"). A digital non-return-to-zero ("NRZ") pulse 201, x(t), may be provided as data input 101 to SerDes system 100. A pulse 201 may go from a negative voltage level −V1 to a positive voltage level +V1 with respect to voltage y-axis 212 as in this example, or a negative pulse may be used in another example. Pulse 201 is prior to equalization, as no pre-cursor and/or post-cursor adjustment is illustratively depicted. Moreover, though NRZ is used in this example, another example may use a different type of modulation, such as ENRZ, PAM4, or other type of modulation. Duration of pulse 201 may be indicated on time x-axis 211 as being a fraction of a microsecond.

After passing through SerDes system 100 having a transfer function h(t), a pulse response 202, y(t), may be obtained as data output 104. Generally, pulse response 202 may be attenuated in voltage, and thus may go from a −V2 to a +V2 voltage level on voltage y-axis 212. Additionally, pulse response 202 may be distorted along a time x-axis 211. An NRZ pulse for example has a pulse width equal to the period of a bit rate, and therefore a pulse response may only be valid for a specific baud rate. Thus, generally a pulse response of a channel can be understood from a resulting signal after being transmitted through a system, h(t), which in this example is for a SerDes link channel. A pulse response y(t) may be mathematically expressed in terms of an input pulse x(t) convolved with a system transfer function h(t), as indicated in equation 203. Even though signals are expressed in the time domain, such signals may be expressed in the frequency domain, where a convolution operator becomes a multiplication operator.

For a high-speed serial system of 20 Gbps or higher, wires, cables, connectors, or other analog components may act generally akin to "low-pass filters". Along those lines, a pulse response y(t) may be for treating SerDes system 100 as a linear or passive system. For a linear system, SerDes system 100 may be understood from analyzing pulse response 202 in view of input pulse 201. Even though the following description is generally in terms of approximately 20 Gbps or higher data rate, low-pass characteristics of such analog components may be observed with frequencies as low as approximately 500 MHz.

Correlating IBIS-AMI SerDes system 100 models to hardware has been a complex task. By comparing actual and simulated pulse responses, behavior of IBIS-AMI models may be enhanced and/or adjusted resulting in higher confidence in successfully representing actual physical behavior in a hardware communication system, such as for example a circuit realization of SerDes system 100. Along those lines, for a system that may be modelled as a passive or linear system, such system may be understood from inputting a known input for comparison with a resulting output. Unfortunately, for a high-speed SerDes system implemented in hardware, obtaining signal samples within a communication path, such as by probing for example, can introduce distortion and/or noise, which may invalidate comparison of actual and simulated signals. For example probing TX data 102 or RX data 103 in hardware may introduce distortion, which may invalidate comparison of simulated and circuit realized TX data 102 or RX data 103.

Moreover, TX equalization, pre-cursor and/or post-cursor, may affect a pulse response. Accordingly, it may be useful to determine how changes in TX settings, such as pre-cursor and/or post-cursor coefficients, affect a pulse response. For a wireless communication system, equalization by a TX equalizer may be analogized to digital pre-distortion by a digital predistorter.

Figure 3:
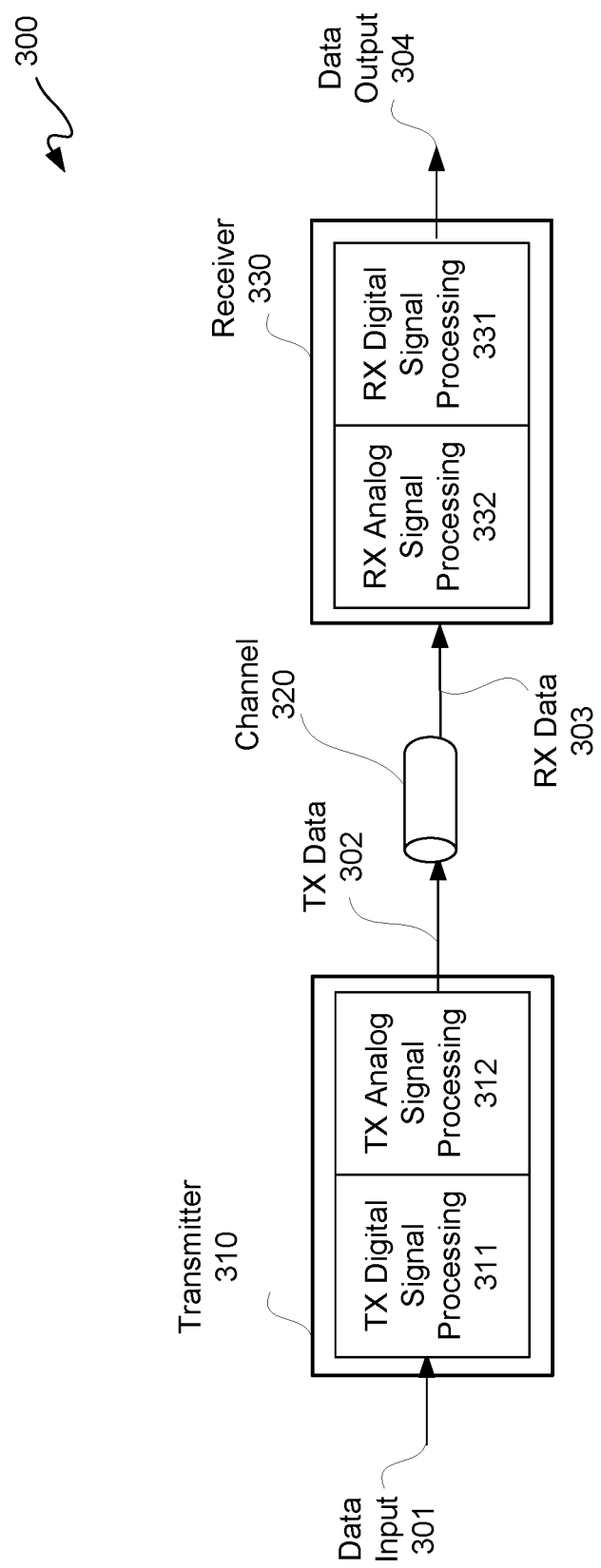
FIG. 3 is a block diagram depicting an exemplary circuit realization of the SerDes system of FIG. 1.

FIG. 3 is a block diagram depicting an exemplary circuit realization of SerDes system 100, namely SerDes system 300. Data input 301 may be provided to a TX digital signal processing section 311 of a transmitter 310. Transmitter 310 may include a TX digital signal processing section 311 and a TX analog signal processing section 312. In TX digital signal processing section 311, there may be a pre-emphasis circuit and/or a feed-forward equalization ("FFE") circuit, among filtering blocks and other known circuits. Digital signal processed data input 301 may be provided to TX analog signal processing section 312. TX analog signal processing section 312 may include a TX buffer and termination impedance, among other known circuits.

TX data 302 output from transmitter 310 may be provided to a passive physical channel 320, which may be a PCB, a backplane, a cable, a connector, or an AMI passive component, among other hardwired communication links that may be used. Passive physical channel 320 may be one or more communications channels; however, for purposes of clarity and not limitation, passive physical channel 320 shall be assumed to be a single communications channel. However, it should be appreciated that a single end-to-end design is just one example of a communications system and more complex communications systems may be modelled in software and realized in hardware.

RX data 303 may be TX data 302 after passing through physical channel 320. RX data 303 may be received by an RX analog signal processing section 332 of a receiver 330. Receiver 330 may include an RX digital signal processing section 331 and an RX analog signal processing section 332. RX analog signal processing section 332 may include an RX buffer, AC coupler, re-biasing circuit, linear equalizer, and termination impedance, among other known circuits. Analog signal processed RX data 303 may be provided to RX digital signal processing section 331. In RX digital signal processing section 331, there may be a clock data recovery ("CDR") circuit, one or more data/bit slicers, an FFE circuit, and a decision feedback equalization ("DFE") circuit, among other filtering blocks and other known circuits. Data output 304 from receiver 330 may be digital data obtained after processing with RX digital signal processing 331.

While the following description is in terms of a hardwired system, in another implementation transmitter 310 and receiver 330 may be for wireless communication, such as for communication with a WiFi or cellular enabled device for example, and thus channel 320 may be an over-the-air channel. However, for purposes of clarity by way of example and not limitation, it shall be assumed that physical channel 320 is a hardwired channel.

Characterizing behavior of these complex functions in transmitter 310 and receiver 330 for high-speed applications can be problematic. Thus, being able to obtain an actual pulse response at a data sensitive location near a source of data output 304 is useful for obtaining an overall impression of how accurate a SerDes system 100 model is, as well as being able to determine analytics for enhancing such model. However, such actual data capture is to be performed in a manner that does not invalidate or otherwise distort such captured data.

To further use a model of a SerDes system 100, hardware serial links, protocol data rates and other constraints, as well as insertion losses and other physical limitations, may be realized in circuitry for comparison with a corresponding model, and then pulse responses for such hardware serial links may be captured, for example at the output of a receiver equalizer. Such simulated and realized pulse responses may then be compared to one another, as well as compared with other receiver outputs, in order to further understand behavior of a hardware high-speed serial link to enhance the level of accuracy of IBIS-AMI or other behavioral models of such hardware high-speed serial link.

As described below, both an EYE scan capture module and a non-destructive pulse capture module may be used for capturing a pulse response in hardware. Along those lines, an EYE scan capture module may be used for coarse tuning, and a pulse response capture module may be used for fine tuning. A difference between using a pulse response capture module and using an EYE scan capture module is that with an EYE scan capture module a bit error rate ("BER") contour may be obtained, where such BER contour may summarize the combined result of multiple bits. Whereas, a pulse response capture module provides more detailed information of individual bits, namely individual pulses, being transmitted than an EYE scan capture module. Pulse response capture for hardware correlation may thus be executed in two different operations, namely a distribution analysis and one-to-one comparison.

To perform pulse response distribution analysis, IBIS-AMI PVT corners may be simulated. Simulated equalized pulse responses for a SerDes link may be captured for such simulated distribution analysis. Similarly, hardware pulse responses of a SerDes link being modelled may be captured over PVT variations. Once pulse responses to be used are recorded, the information obtained from such pulse responses may be used to obtain a distribution, generally best, worst, and typical waveforms. These waveforms may be superimposed on one another and analyzed to evaluate distribution in one or more IBIS-AMI models representing an actual hardware distribution over PVT variation.

Figure 4:
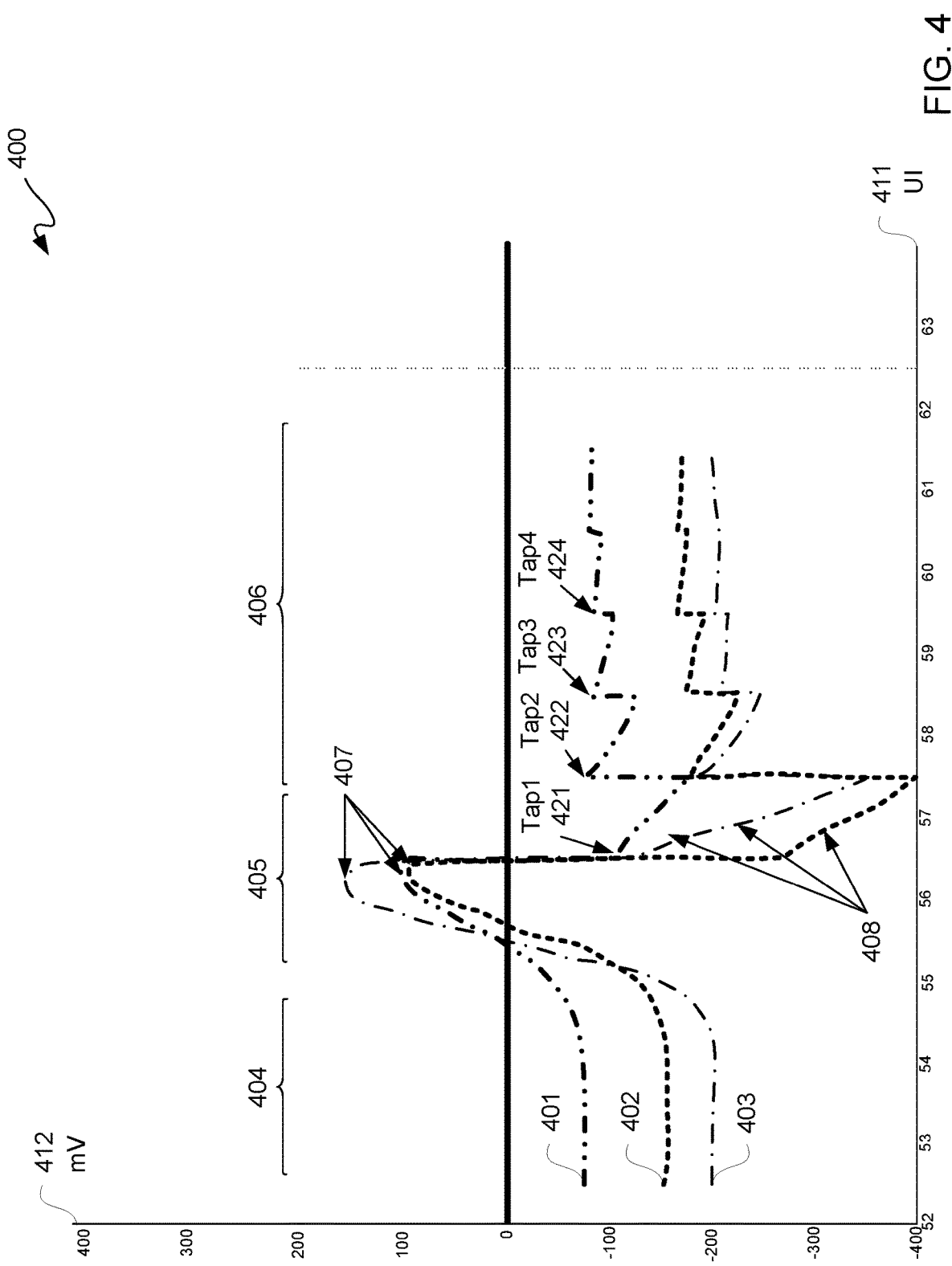
FIG. 4 is a signal diagram depicting an exemplary simulated pulse response distribution for three different boundaries of the SerDes system of FIG. 1.

FIG. 4 is a signal diagram depicting an exemplary simulated pulse response distribution 400 for three different boundaries of a SerDes system 100. Pulse response distribution 400 for this example is an IBIS-AMI pulse response distribution; however, other types of behavioral models for simulating a communications system may be used in other implementations.

Post-DFE pulse responses 401 through 403 provide information about a model of a SerDes system 100. Along those lines, pulse height, pulse width, pulse tail length, pulse tail slope, pre-cursor equalization, and/or post-cursor equalization, among other parameters of pulse responses 401 through 403 may be used to understand more about a model of a SerDes system 100. For NRZ, each symbol is one bit or one pulse with two possible logic levels. However, modulations other than NRZ may be used. For example, for PAM4, each symbol is two bits or one pulse with four possible logic levels.

Pulse responses 401 through 403 are for three different PVT models, namely respectively a "slow corner", a "typical corner", and a "fast corner". These terms, which are generally expressed herein, may reflect actual values as may vary from application-to-application. However, for purposes of clarity by way of example and not limitation, pulse responses 401 through 403 may be associated with a unit interval ("UI") x-axis 411 and a millivolt ("mV") y-axis 412 in a range of approximately +400 to −400 mV. A UI may vary from application-to-application depending on a baud rate used and/or granularity of taps of a phase interpolator delay line or other delay line modelled and correspondingly implemented in hardware.

Along those lines, a model of a DFE may include a delay line with various taps. A main cursor tap ("Tap1") 421 and one or more subsequent taps following such main cursor tap, such as for example taps 422 through 424 which in this example correspond to post cursor taps 2 through 4 sequentially following main cursor tap 424. Post-equalization pulse responses 401 through 403 may include a pre-cursor or pre-emphasis region 404, a main pulse or main cursor region 405, and a post-emphasis or post cursor region 406. Within main cursor region 405 may be pulse response peaks 407 and corresponding pulse response tails 408 respectively for pulse responses 401 through 403. Thus, with a model of a SerDes system 100 including a DFE, pulse responses at a main cursor tap and one or more other taps, such as pre-cursor and/or post-cursor taps, may be evaluated.

Figure 5:
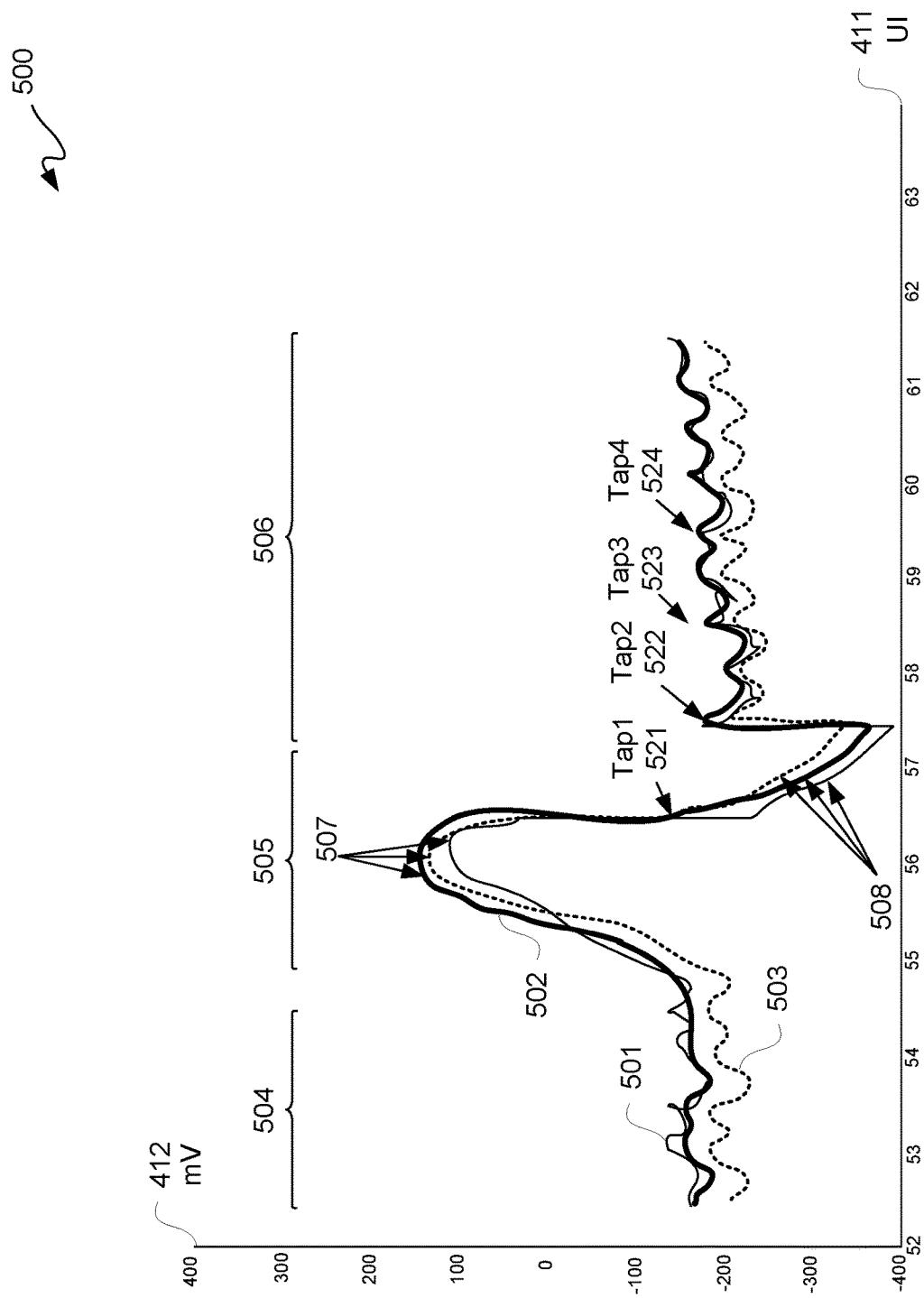
FIG. 5 is a signal diagram depicting an exemplary actual hardware pulse response distribution.

FIG. 5 is a signal diagram depicting an exemplary actual hardware pulse response distribution 500. Pulse response distribution 500 for this example is for an FPGA hardware implementation of a SerDes system 100 corresponding to an IBIS-AMI model used for the pulse response distribution 400 of FIG. 4. For this example, pulse response distribution 500 is obtained from an output of an EYE scan module of an FPGA, which provides a parallel path for non-disruptive and non-distortion inducing sampling. For purposes of clarity and not limitation, rather than superimposing pulse response distribution 400 onto pulse response distribution 500, simultaneous reference is made to pulse response distributions 400 and 500 of FIGS. 4 and 5, respectively.

Correspondence of post-DFE pulse responses 501 through 503 with pulse responses 401 through 403 provide information about a model of a SerDes system 100. Along those lines, comparisons of pulse height, pulse width, pulse tail length, pulse tail slope, pre-cursor equalization, and/or post-cursor equalization, among other parameters of pulse responses 501 through 503 with corresponding pulse responses 401 through 403 may be used to understand more about a model of SerDes system 100 for enhancement of such model to more accurately reflect an actual hardware implementation.

Pulse responses 501 through 503 are for three different PVT hardware implementations or for three different sets of settings for a hardware implementation to respectively obtain a "slow corner", a "typical or nominal corner", and a "fast corner". These terms, which are generally expressed herein, may reflect actual values as may vary from application-to-application. However, for purposes of clarity by way of example and not limitation, pulse responses 501 through 503 may be associated with a unit interval ("UI") x-axis 411 and a millivolt ("mV") y-axis 412 in a range of approximately +400 to −400 mV. Again, a UI may vary from application-to-application depending on a baud rate used and/or granularity of taps of a phase interpolator delay line or other delay line. In this example to generate pulse responses 501 through 503, combinations of minimum, nominal and maximum voltages and minimum, nominal and maximum temperatures for various parameters were used in an actual hardware implementation of a SerDes system 100.

Again, an actual DFE may include a delay line with various taps. A main cursor tap ("Tap1") 521 and one or more subsequent taps following such main cursor tap, such as for example taps 522 through 524 which in this example correspond to post cursor taps 2 through 4 sequentially following main cursor tap 521. Taps 521 through 524 correspond to taps 421 through 424, and thus a model of a SerDes system 100 may be adjusted for a synthetic or virtual DFE and/or other synthesis templates, for example an HDL or other language library of templates for synthesis software tools. This adjustment may thus be to more accurately reflect an actual implementation of a DFE and/or other synthesis templates.

Post-equalization pulse responses 501 through 503 may include a pre-cursor or pre-emphasis region 504, a main pulse or main cursor region 505, and a post-emphasis or post cursor region 506, which likewise correspond to regions 404 through 406. Within main cursor region 505 may be pulse response peaks 507 and pulse response tails 508 corresponding to peaks 407 and tails 408 respectively for correspondence between pulse responses 501 through 503 and pulse responses 401 through 403.

Thus, with a model of a SerDes system 100 including a model of a DFE, pulse responses at a main cursor tap and one or more other taps, such as pre-cursor and/or post-cursor taps, may be evaluated against actual implementation results of pulse responses at corresponding DFE taps of a circuit realization of SerDes system 100 including a DFE circuit.

Figure 6:
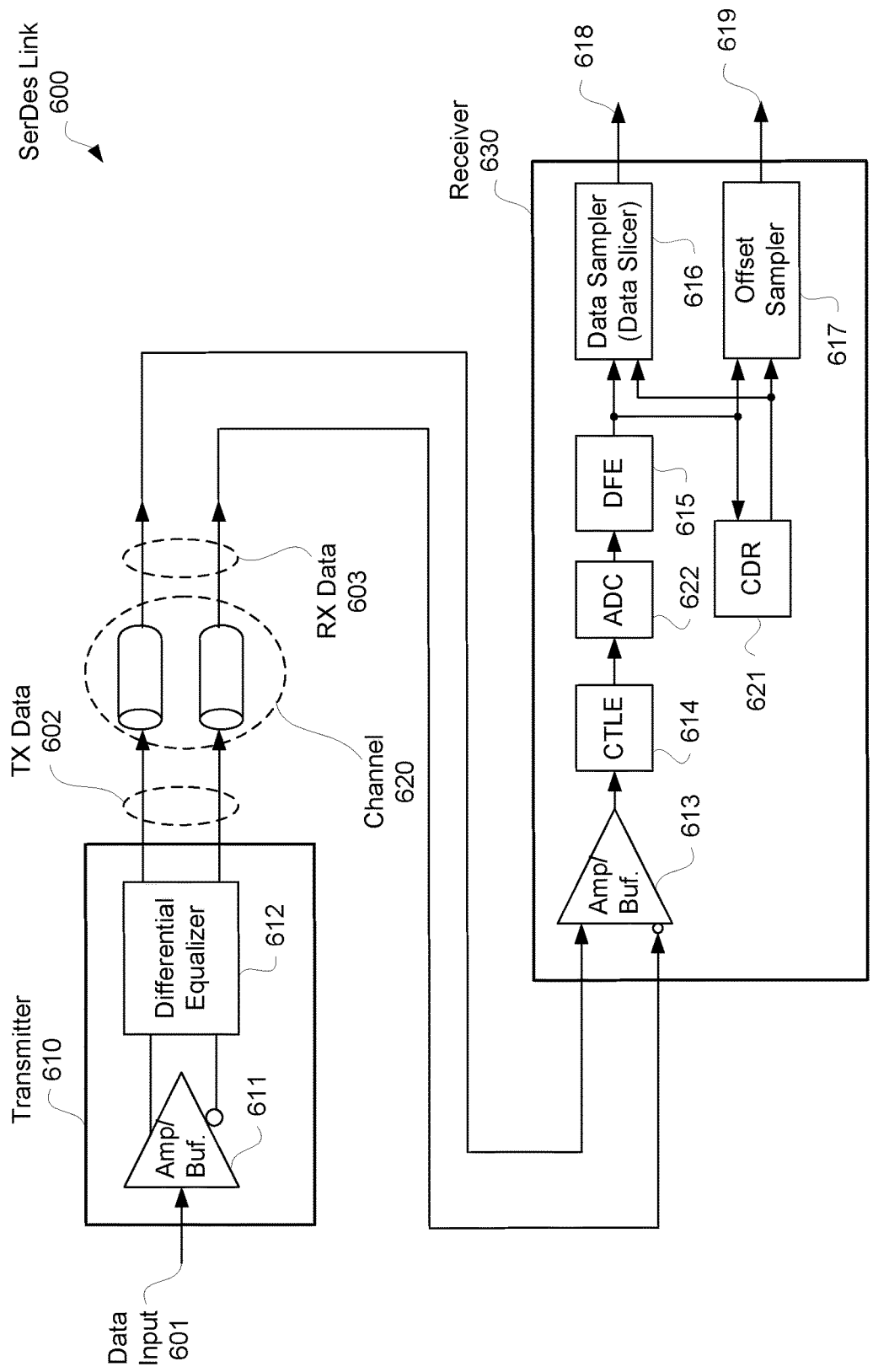
FIG. 6 is a schematic diagram depicting an exemplary SerDes link for both a modelled SerDes system of FIG. 1 and a circuit realized SerDes system of FIG. 3.

For purposes of clarity by way of example and not limitation, FIG. 6 is a schematic diagram depicting an exemplary SerDes link 600 for both a modelled SerDes system 100 and a circuit realized SerDes system 300. SerDes link 600 may be modelled using IBIS-AMI models and may be implemented in hardware, such as by using resources of one or more FPGAs. It should be understood that this or another form of SerDes link 600 may be used. For purposes of clarity and not limitation, no distinction is made between either modelled or circuit realized components of SerDes link 600.

Single-ended data input 601 is provided to a differential amplifier/output buffer 611 of transmitter 610. A differential output from differential amplifier/output buffer 611 is input to a differential equalizer 612 of transmitter 610, such as for finite impulse response ("FIR") equalization. Differential equalizer 612 outputs TX data 602 onto a differential serial communications channel 620 to provide RX data 603 to a SerDes receiver 630.

A differential amplifier/input buffer 613 of receiver 630 is configured to receive RX data 603 to output single-ended serial data to a continuous-time linear equalization equalizer or circuit ("CTLE") 614 of receiver 630. Differential amplifier/input buffer 613 may include an automatic gain control circuit ("AGC").

Equalized serial data output from CTLE 614 may be provided to DFE equalizer or circuit ("DFE") 615. An analog-to-digital converter circuit ("ADC") 622 may be coupled between CTLE 614 and DFE 615. Moreover, a feed-forward equalizer or circuit ("FFE") (not shown) may be coupled between ADC 622 and DFE 615, and a CDR 621 may be coupled to CLTE 614, DFE 615 and data samplers 616 and 617. Additional details of an EYE scan circuit using a center EYE sampling circuit and an offset EYE sampling circuit may be found for example in U.S. Pat. No. 8,913,688.

For purposes of clarity and not limitation, many other known components and interconnections of a SerDes link 600 are not described. Output of CTLE 614 may be provided to DFE 615 for decision feedback equalization, and output of DFE 615 may be provided to data sampler or slicer 616 and offset sampler 617 for respectively providing serial recovered output data 618 and serial offset data 619.

Figure 7:
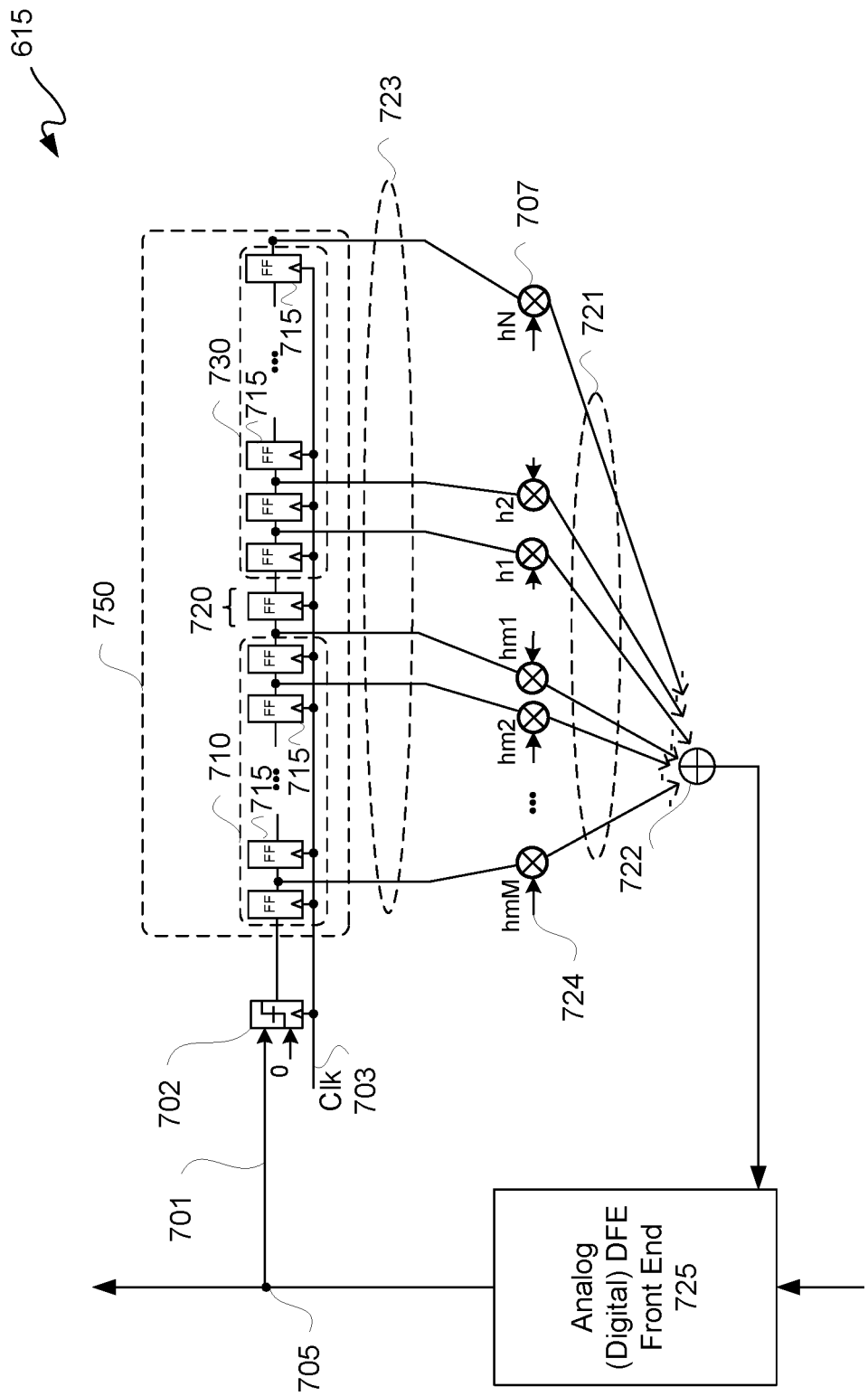
FIG. 7 is a schematic diagram depicting an exemplary portion of a decision feedback equalizer ("DFE").

FIG. 7 is a schematic diagram depicting an exemplary portion of a DFE 615, modelled or circuit realized. DFE 615 includes an input comparator ("input data slicer") 702, a delay line 750, a plurality of multipliers 707, and a subtractor/combiner 722, as well as an analog DFE front end 725. In another implementation, DFE 615 may have a digital DFE front end 725. Again, for purposes of clarity by way of example and not limitation, other known components of a DFE are not described in unnecessary detail.

An analog input signal 701 may be a data input to input data slicer 702 to output a digital signal to delay line 750. Input data slicer 702 may have an input coupled to zero volts (i.e., ground) as a threshold input for comparison against levels of analog input signal 701, such as for NRZ modulation for example. However, PAM or other modulation may likewise be used in systems with a dispersive effect where equalization is used. Moreover, a threshold input may be different for different modulations. For a digital input signal 101 to a digital DFE 615, input data slicer 702 may be omitted. However, for purposes of clarity, it shall be assumed that ADC 622 is not used and that DFE 615 is an analog DFE.

Input data slicer 702 and registers 715 of delay line 750 may all be clocked responsive to a same clock signal 703. Input signal 701 may be the output of an equalizer, such as a feedback input of DFE 615 or an output of CTLE 614.

Output of input data slicer 702 may be an input to a delay line 750 formed of a series of registers 715 with respective taps 723 between registers 715. Taps 723 may correspond to taps 521 through 524 for a hardware implementation and to taps 421 through 424 for a software implementation. An initial portion of delay line 750 may be optional M registers of a precursor stage 710; a middle portion of delay line 750 may be a 1-stage main cursor register stage 720; and a later portion of delay line 750 may be N registers of a postcursor stage 730. In this example, M and N are respective positive integers equal to or greater than one.

Taps 723 of precursor stage 710 may provide respective inputs to corresponding multipliers 707. Other inputs to multipliers may be corresponding FIR filter coefficients, namely cancellation coefficients 724. Along those lines, positive values of precursor ISI coefficients hmM to hm1 may be input to corresponding multipliers 707 for correspondence from a first to a last tap, where hm1 is a first precursor tap and hmM an Mth precursor tap in this example, of precursor stage 710. Positive values of postcursor ISI coefficients h1 to hN may be input to corresponding multipliers 707 for correspondence from a first to last tap of postcursor stage 730. Actual values of these coefficients, h1 to hN and hm1 to hmM, may be either positive or negative. Outputs of multipliers 707 may be weighted DFE precursor and postcursor decisions 721 for input to minus ports of a subtractor/combiner 722. In a conventional DFE, a feedback/output node 705 of DFE 615 may be coupled to re-use decisions from such illustratively depicted DFE path as is known.

By inputting zero for cancellation coefficients 724 other than for a tap under consideration, any of taps 421 through 424 for example may be examined without contribution from the other simulated taps. Likewise, by inputting zero for cancellation coefficients 724 other than a tap under consideration, as any of taps 521 through 524 for example may be examined without contribution from the other hardware taps.

By taking a pulse response after DFE with an EYE scan module and/or a pulse response capture module, such samples may be obtained without introducing distortion invalidating such pulse response distribution and pulse response, respectively.

Returning to FIGS. 4 and 5, by comparing pulse response distributions 400 and 500 to one another, with or without superimposition of one to another, comparisons may be made by comparing parameters of such distributions to one another for determination of differences. These differences can be then checked against corresponding thresholds for specifications of a design.

In addition to comparison of pulse response distributions, a one-to-one pulse response analysis may be performed. For a one-to-one pulse response analysis, best, worst, and typical pulse responses may be independently compared to one another as between a software simulation of a SerDes link 600 and a hardware implementation of a SerDes link 600.

Figure 8:
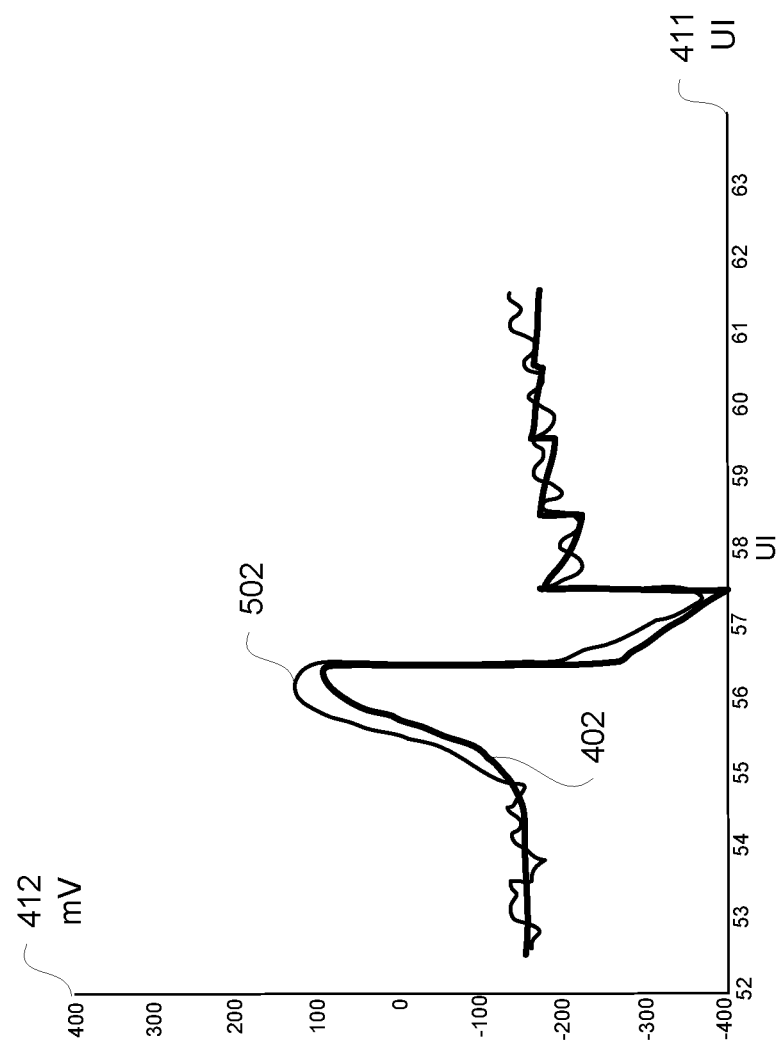
FIG. 8 is a signal diagram depicting an exemplary superimposition of a simulated pulse response and a corresponding hardware pulse response.

FIG. 8 is a signal diagram depicting an exemplary superimposition of a simulated pulse response 402 and a corresponding hardware pulse response 502. Thus, rather than comparing simulated and actual pulse response distributions, individual simulated and actual pulse responses may be compared to one another. Even though simulated pulse response 402 and a corresponding hardware pulse response 502 are illustratively depicted, pulse responses 401 and 501 may be compared with one another, and pulse responses 403 and 503 may be compared with one another. Pulse responses 402 and 502 may be compared for pulse height, pulse width, pulse tail length, pulse tail slope, pre-cursor equalization, and/or post-cursor equalization, among other parameters of pulse responses 401 through 403 and 501 through 503.

Analog filters may have fewer discontinuities than digital filters, and so discontinuities appear less often in analog pulse responses than in digital pulse responses. In order to address discontinuities to obtain a better comparison, a pulse response may be artificially reconstructed by removing or zeroing out DFE tap weights, such as cancellation coefficients 724. Thus, all cancellation coefficients 724 may be set to zero, or optionally, a feedback path of a DFE may have a zero bypass path. For purposes of clarity by way of example and not limitation, it shall be assumed that all cancellation coefficients or tap weights 724 are set to zero to produce unweighted pulse responses.

Figure 9:
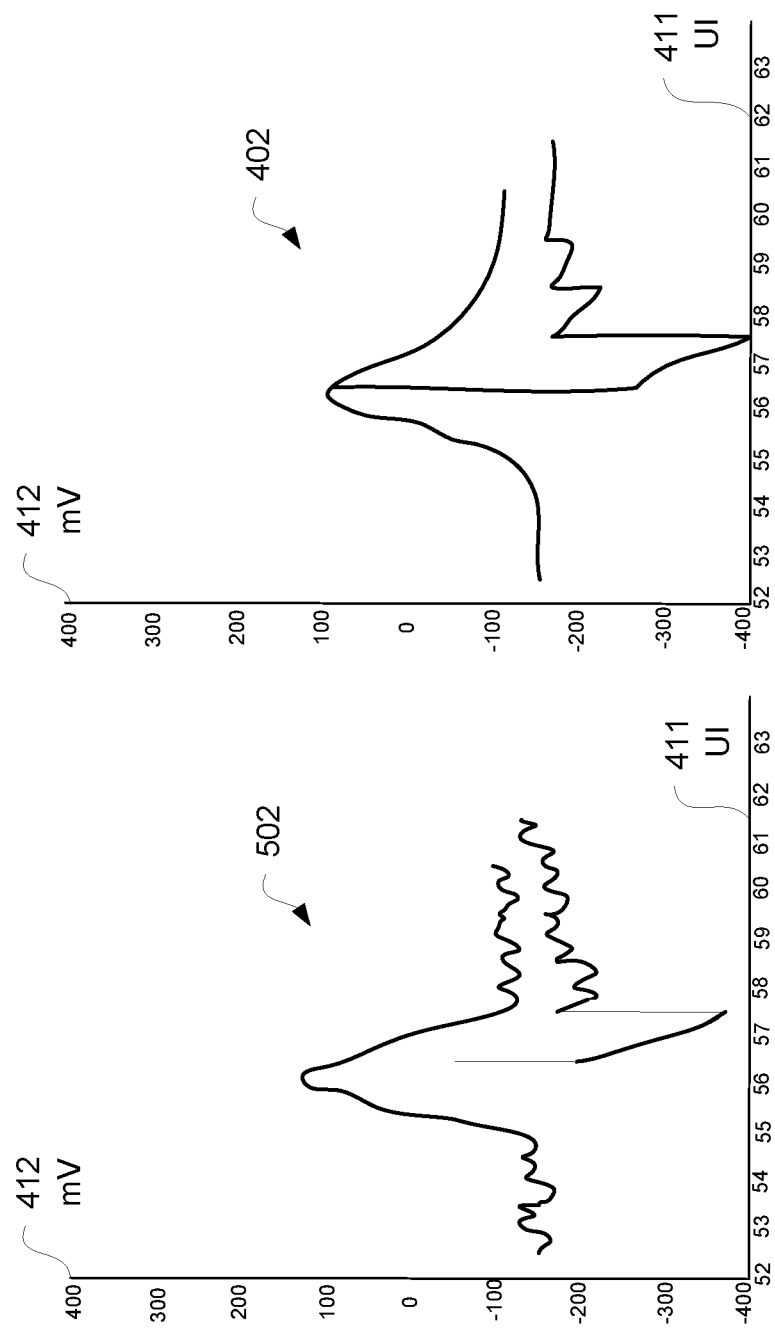
FIG. 9A is a signal diagram depicting an exemplary hardware pulse response with all DFE tap weights removed.
FIG. 9B is a signal diagram depicting an exemplary simulated pulse response with all DFE tap weights removed.

FIG. 9A is a signal diagram depicting an exemplary hardware pulse response 502 with all DFE tap weights removed, and FIG. 9B is a signal diagram depicting an exemplary simulated pulse response 402 with all DFE tap weights removed. Again in these examples, pulse response 502 is reconstructed from a hardware implementation/circuit realization of a SerDes link 600, such as in an FPGA for example, and pulse response 402 is a reconstructed pulse response from an IBIS-AMI simulation of a SerDes link 600. With DFE tap weights, effectively a digital reconstruction of a pulse response may be realized, such as in FIG. 8. However, by removing DFE tap weights, effectively an analog reconstruction of a pulse response may be realized. By analyzing these digital and analog reconstructions of pulse responses individually, an IBIS-AMI model may adjusted to enhance subsequent simulations.

Link-to-link IBIS-AMI model to hardware correlation may be implemented and validated using one or more of eye contour, adaptation coefficient, and/or bathtub curve comparisons. With the above-description borne in mind, link-to-link simulation to hardware correlation is described below in additional detail for a real-time, nondestructive, hardware pulse response.

Though the description herein is for correlation between a behavioral model and a corresponding circuit realization for a communications system, other types of networks may benefit from this technology. Along those lines, the description herein is applicable to circuit and system level validation. Using articulately designed test cases, a user can observe behavior of any of a variety of circuits in a system for comparison with a corresponding model for a circuit or an overall system.

Figure 10:
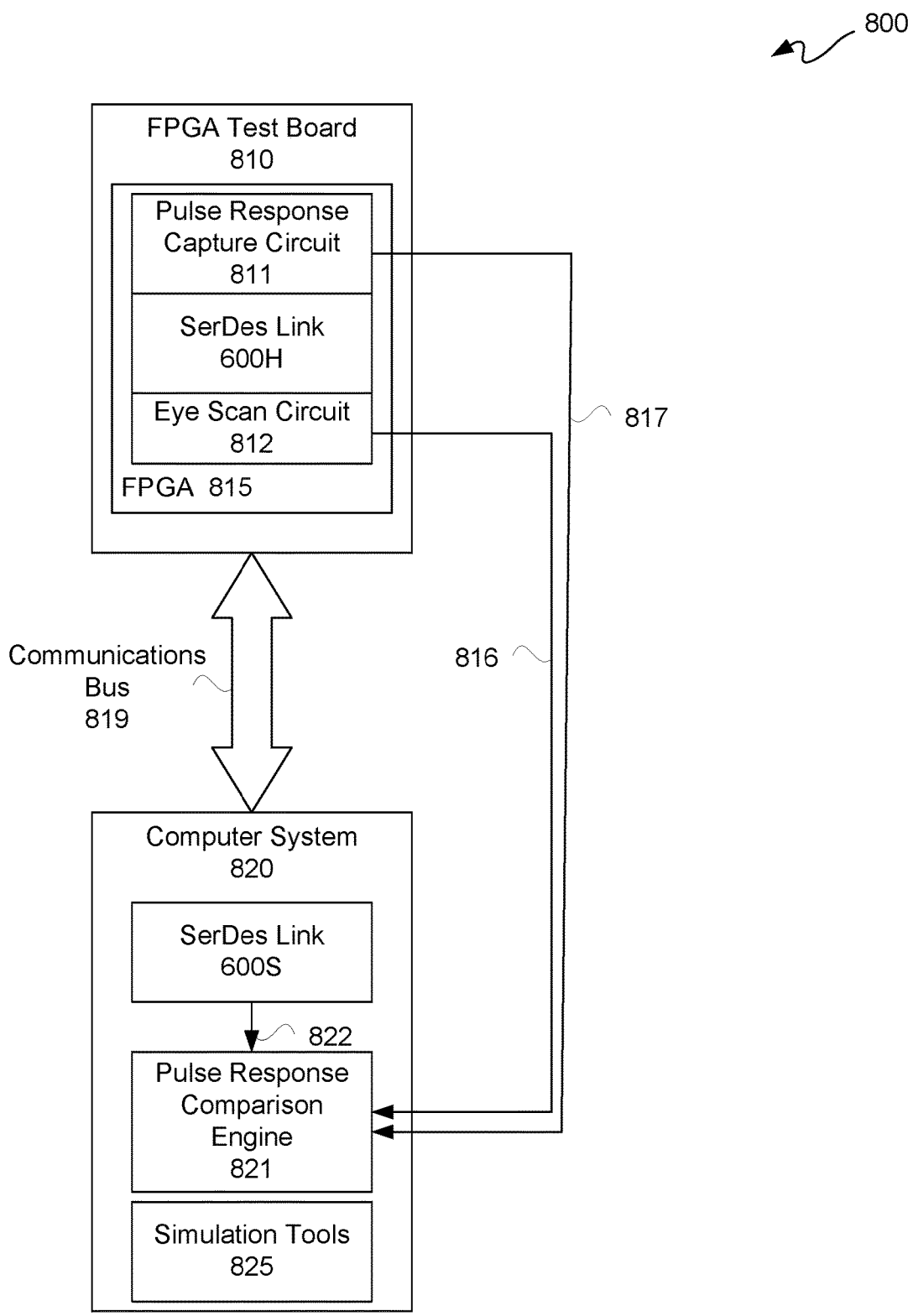
FIG. 10 is a function-level block diagram depicting an exemplary test system for comparison of a communications system modelled with a behavioral model and implemented with a circuit realization.

FIG. 10 is a function-level block diagram depicting an exemplary test system 800 for comparison of a communications system modelled with a behavioral model and implemented with a circuit realization. FIG. 10 is a non-limiting example of an FPGA-based test system 800; however, the description herein is applicable to other types of test systems for comparison of a communications system modelled with a behavioral model and implemented with a circuit realization, such as an ASSP, DSP, ASIC, or other type of integrated circuit or integrated circuits. Moreover, even though a single integrated circuit chip, namely FPGA 815, is illustratively depicted, more than one integrated circuit chip may be used for providing a SerDes Link 600 in hardware ("600H"). Even though a non-limiting example of a single computer system 820 is illustratively depicted, a network of computer systems may be used. Along those lines, a computing device of a computer system 820 may be used apart from one or more components of a computer system coupled to such computing device.

FPGA 815 is coupled for electrical communication with FPGA test board 810, such as a PCB. Resources of FPGA 815 may be used to instantiate a SerDes link 600H. More particularly, FGPA 815 may include an EYE scan circuit 812 and a pulse response capture circuit 811 coupled to a receiver of SerDes link 600H, such as previously described by way of example. Pulse response capture circuit 811 may be configured for non-destructive capture of a pulse response, and EYE scan circuit 812 may be configured for non-destructive capture of a pulse response distribution.

Computer system 820 may be programmed with simulation software tools 825 embodying one or more programs for providing a behavioral model for simulating operation of a communications system, such as a SerDes link 600 in software ("600S"), to obtain a pulse response 822. A pulse response 822 output from SerDes link 600S and a pulse response 817 output from pulse response capture circuit 811 may be provided to a pulse response comparison engine 821, where such pulse response comparison engine 821 is programmed in computer system 820 for comparing pulse responses, such as previously described. Moreover, a distribution of pulse responses 822 may be accumulated in pulse response comparison engine 821 for comparison with a pulse response distribution 816 output from EYE scan circuit 812.

FPGA 815 may be in communication with computer system 820 via communications bus 819 coupled between FPGA test board 810 and computer system 820. There are many forms of communications buses any of which may be used along with an I/O interface of computer system 820 for communication. Along those lines, FPGA 815 may be controlled by computer system 820 for synchronous operation for providing corresponding data sets for generation of corresponding pulse responses from SerDes links 600H and 600S. Likewise, corresponding pulse responses or corresponding pulse response distributions may be compared by pulse response comparison engine 821. Additionally, computer system 820 may be used for setting and changing settings of SerDes link 600H while correspondingly changing settings of SerDes link 600S. Examples of setting that may be made and/or changed include type of communication channel (e.g., PCB, backplane, cable, connector, AMI passive component or the like), data rate, modulation type, TX voltage swing, TX pre-cursor coefficients, and/or TX post-cursor coefficients. Along those lines, such TX settings may be swept. Moreover, PVT voltages levels may be changed to mimic different PVT corners. Additionally, FPGA test board 810 may be located in an environmental chamber to change operating temperature, and changes in operating temperatures may be correspondingly simulated by computer system 820 for SerDes link 600S.

Figure 11:
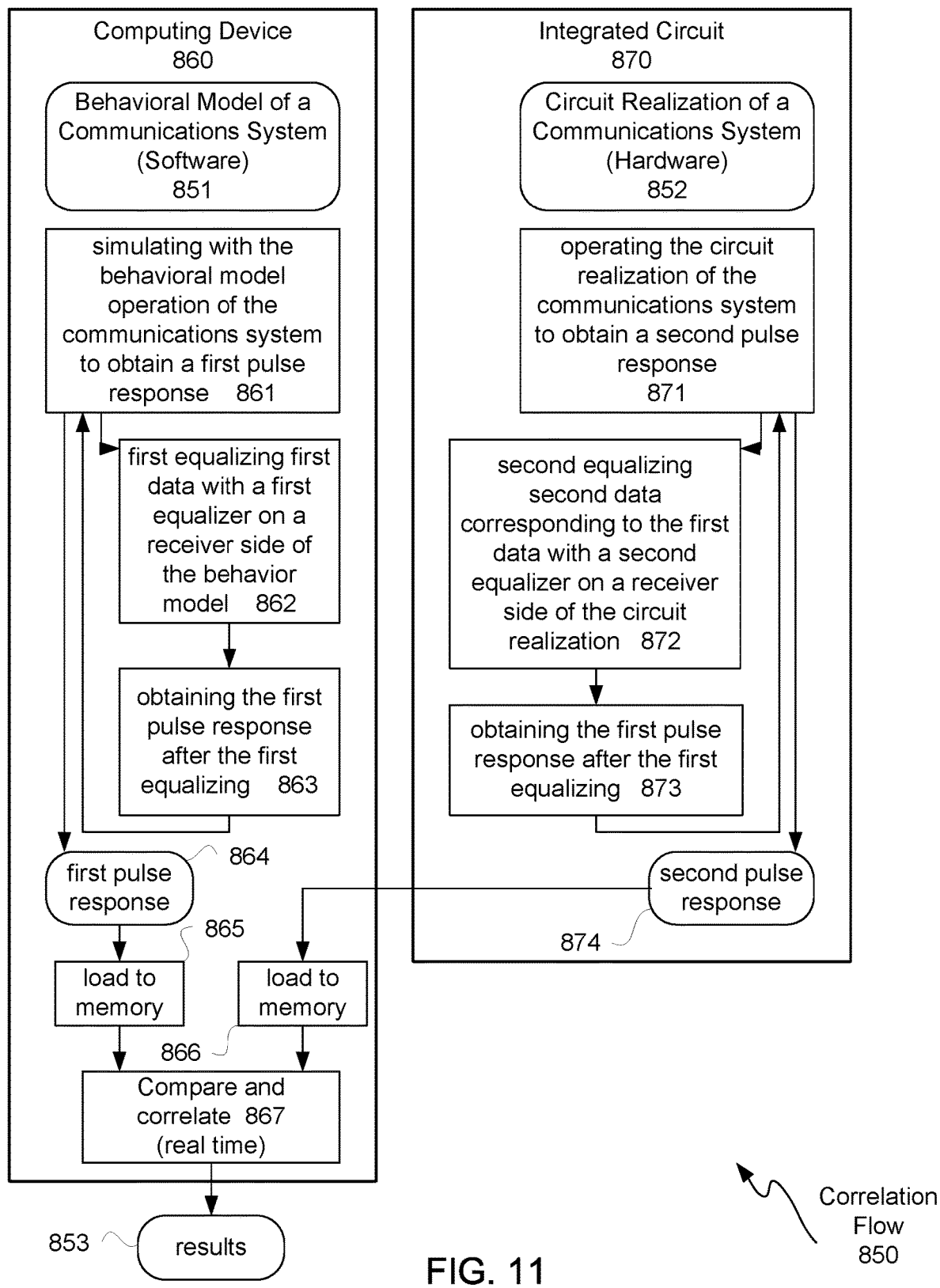
FIG. 11 is a flow diagram depicting an exemplary correlation flow.

FIG. 11 is a flow diagram depicting an exemplary correlation flow 850. Correlation flow 850 corresponds to test system 800 for comparison of a communications system modelled with a behavioral model and implemented with a circuit realization.

A computing device 860 includes a behavioral model of a communications system (software) 851, such as for example a SerDes link 600S, and an integrated circuit 870, such as for example an FPGA 815. FPGA 815 includes a circuit realization of such a communications system (hardware) 852, such as for example a SerDes link 600H.

At 861, a behavioral model 851 may be used to simulate on a computing device 860 operation of a communications system to obtain a "first" pulse response 864, such as pulse response 822 for example. The terms "first" and "second" are used to differentiate between same sounding items and not to imply any order.

Simulating at 861 may include operations at 862 and 863. At 862, a "first" data may be equalized with a "first" equalizer, such as a DFE circuit for example, on a receiver side of behavioral model 851. At 863, a "first" pulse response 864 may be obtained after such "first" equalizing at 862. One or more operations described herein performed with computing device 860 may be stored as instructions on non-transitory computer readable storage medium for storing one or more programs.

In parallel with operations at 861, at 871 a circuit realization 852 of such a communications system may be operated or run to obtain a "second" pulse response 874. Simulating at 861 and operating at 871 may be performed in parallel for performing comparing and correlating at 867 in real time, namely keeping up with a continuous stream of pulse responses 864 and 874 for receiving such pulse response pairs in tandem.

Operating at 871 may include operations at 872 and 873. At 872, "second" equalizing a "second" data corresponding to such "first" data may be performed with a "second" equalizer, such as a DFE circuit for example, on a receiver side of circuit realization 852. At 873, "second" pulse response 874 may be obtained after such "second" equalizing at 872.

Such "second" pulse response 874 may be sent from circuit realization 852 to be loaded at 866 into memory of computing device 860. Such "first" pulse response 864 may be loaded at 865 to memory, such as RAM, flash or register buffer memory, of computing device 860. At 867, such "first" pulse response and "second" pulse response may be read from buffer memory of and by computing device 820 and compared and correlated with one another by computing device 860. At 867, results 853 of such comparison and correlation at 867 may be stored in memory and/or output from computing device 860 for adjustment of a behavioral model. Results 853 may be used make adjustments to settings of a transmitter and/or a receiver. Along those lines, a receiver may be configured to be auto-adaptive to reception of RX data; however, auto-adaptive setting associated with such a receiver may be suboptimal. Thus, at 867, settings, such as auto-adaptive settings for example, for a behavioral model may be enhanced or otherwise adjusted to provide a closer correlation with an actual behavior of a corresponding circuit realization, such as for example hardware behavior of an auto-adaptive receiver.

Figure 12:
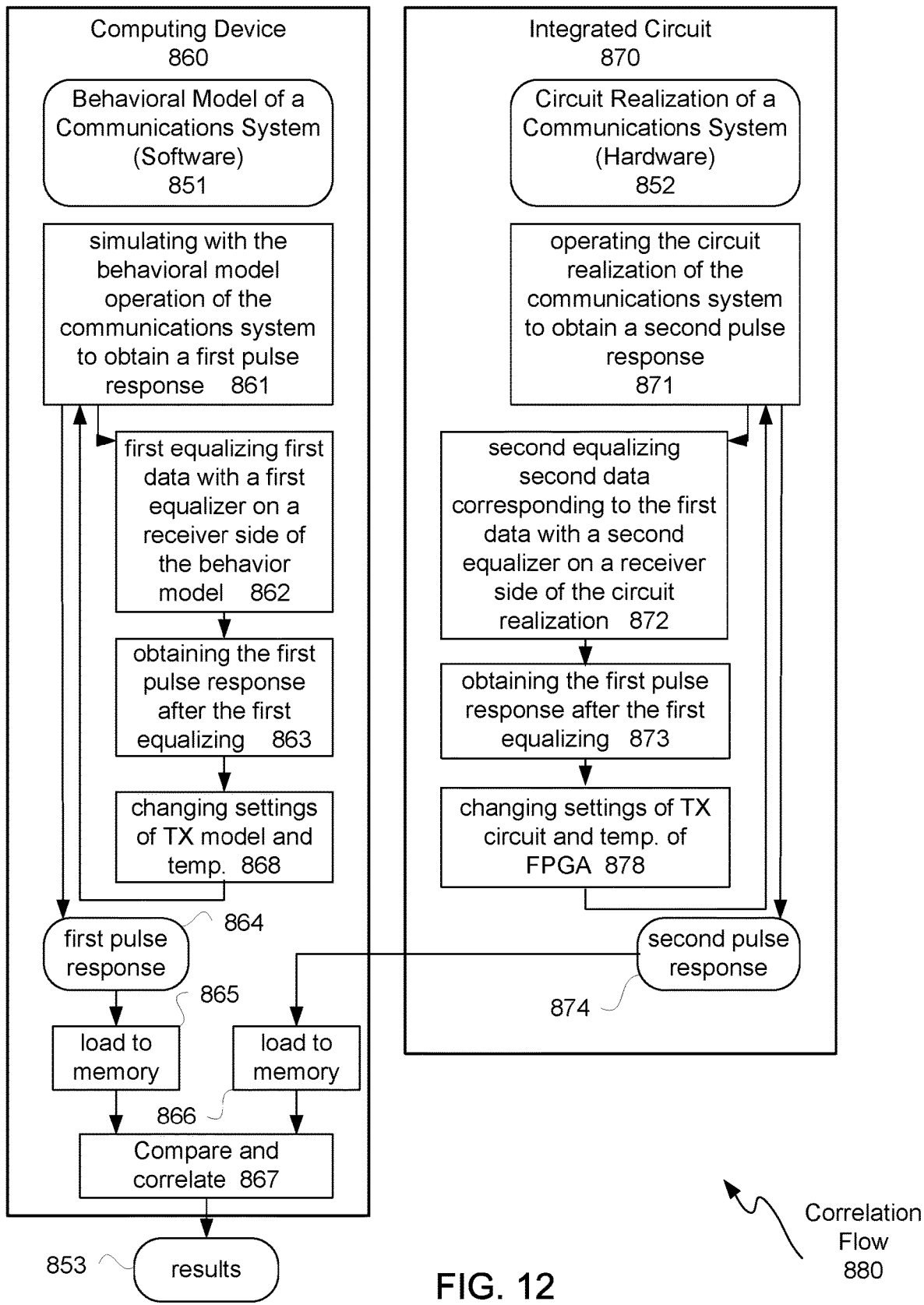
FIG. 12 is a flow diagram depicting another exemplary correlation flow.

FIG. 12 is a flow diagram depicting another exemplary correlation flow 880. Correlation flow 880 corresponds to test system 800 for comparison of a communications system modelled with a behavioral model and implemented with a circuit realization. Correlation flow 880 is similar to correlation flow 850 of FIG. 11, and so only the differences are described below for purposes of clarity and not limitation.

Another operation at 861 may include at 868 changing settings, including voltages, of a TX model of behavioral model 851, and simulated temperatures. Likewise, another operation at 871 may include at 878 changing settings, including voltages, of a TX circuit of circuit realization 852, and changing temperature of an integrated circuit, such as FPGA 815. Operation 868 may be performed after a "first" pulse response 864 is obtained at 863 in order to change boundary conditions for a next "first" pulse response 864. Likewise, operation 878 may be performed after a "second" pulse response 874 is obtained at 873 in order to change boundary conditions for a next "second" pulse response 864. Accordingly, simulating at 861 and operating at 871 may be for combinations of different voltages and temperatures associated with boundary conditions of such a communications system to obtain a "first" pulse response 864 and a "second" pulse response 874 for each of such combinations. Thus, comparing at 867 of each correlated pair of a "first"

pulse response 864 and a "second" pulse response 874 may be for each of such combinations. Moreover, at 867 settings of behavioral model 851 may be adjusted to cause behavioral model 851 to more closely behave like circuit realization 852. Such one or more adjustments of settings of behavioral model 851 at 867 may be responsive to results 853 obtained from one or more comparisons made at 867 for one or more of such combinations.

Figure 13:
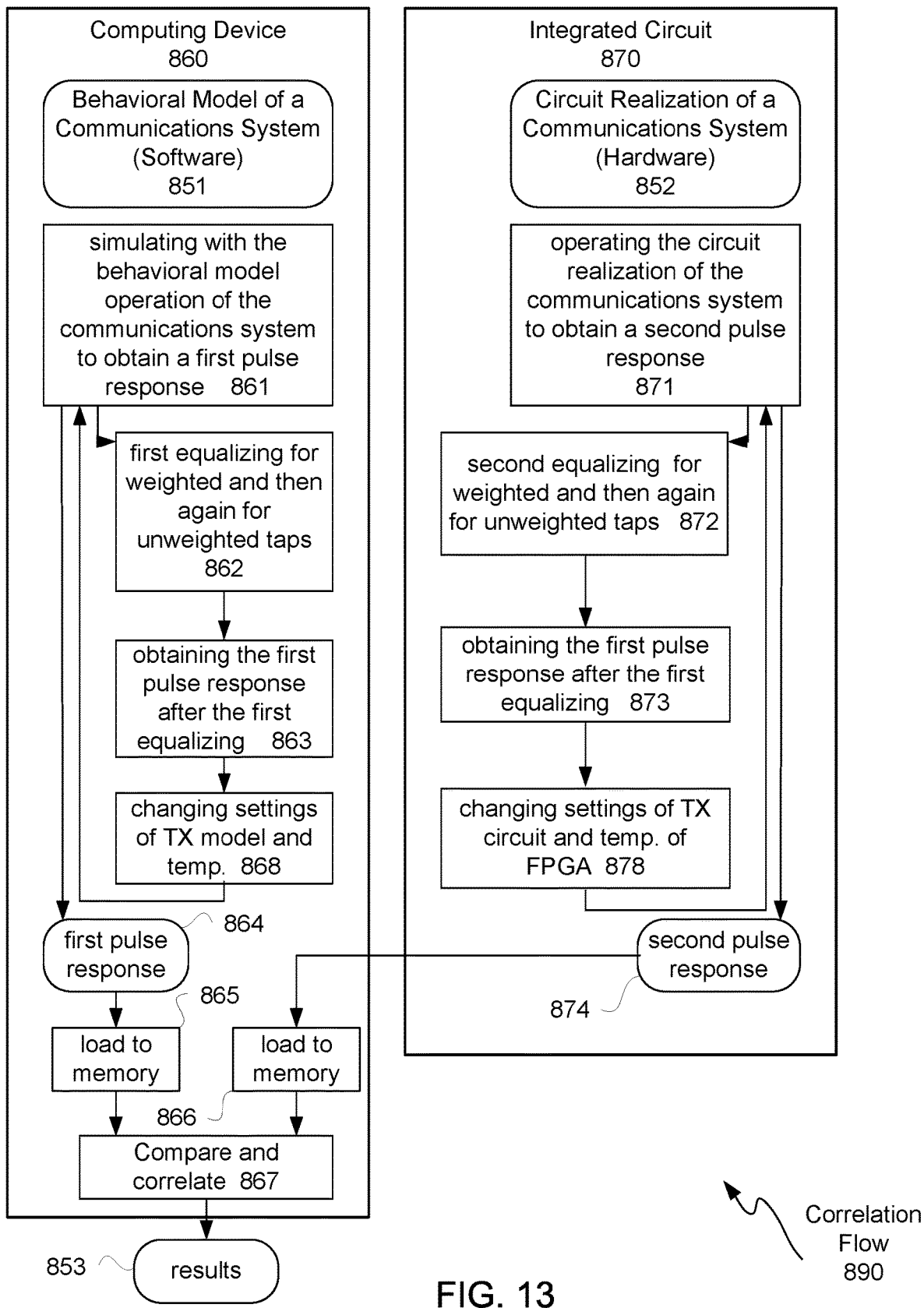
FIG. 13 is a flow diagram depicting yet another exemplary correlation flow.

FIG. 13 is a flow diagram depicting yet another exemplary correlation flow 890. Correlation flow 890 corresponds to test system 800 for comparison of a communications system modelled with a behavioral model and implemented with a circuit realization. Correlation flow 890 is similar to correlation flow 880 of FIG. 12, and so only the differences are described below for purposes of clarity and not limitation.

In correlation flow 890 operations at 862 and 872 may be performed as previously described for weighted taps of a DFE for a first instance for generating pulse responses 864 and 874, respectively, and for a second instance for generating pulse responses 864 and 874, taps of a DFE may be unweighted. Such second instance of equalization at 862 and 872 may be performed prior to changing at 868 and 878, respectively, to provide weighted and unweighted instances of decision feedback equalizations of pulse responses for pulse responses 864 and 874.

An integrated circuit 870, such as an FPGA 815, may include embedded memory and one or more embedded processor cores. Along those lines, even though a computing device 860 may be coupled to an FPGA 815 through a computer interface of such FPGA for controlling operations 871, 872, 873, and/or 878, as described above, FPGA 815 may be programmed to execute operations 871, 872, 873, and/or 878 using such an embedded computing system. Operations 861, 862, 863, 868, 865, 866, and 867, as well as operations 871, 872, 873, and/or 878, may be implemented in a tangible machine-readable medium, and thus may form all or portions of a program product 1520, as described below in additional detail with reference to FIG. 15.

Because one or more of the examples described herein may be implemented in an FPGA, a detailed description of such an IC is provided. However, it should be understood that other types of ICs may benefit from the technology described herein.

Programmable logic devices ("PLDs") are a well-known type of integrated circuit that can be programmed to perform specified logic functions. One type of PLD, the field programmable gate array ("FPGA"), typically includes an array of programmable tiles. These programmable tiles can include, for example, input/output blocks ("IOBs"), configurable logic blocks ("CLBs"), dedicated random access memory blocks ("BRAMs"), multipliers, digital signal processing blocks ("DSPs"), processors, clock managers, delay lock loops ("DLLs"), and so forth. As used herein, "include" and "including" mean including without limitation.

Each programmable tile typically includes both programmable interconnect and programmable logic. The programmable interconnect typically includes a large number of interconnect lines of varying lengths interconnected by programmable interconnect points ("PIPs"). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device, or CPLD. A CPLD includes two or more "function blocks" connected together and to input/output ("I/O") resources by an interconnect switch matrix. Each function block of the CPLD includes a two-level AND/OR structure similar to those used in Programmable Logic Arrays ("PLAs") and Programmable Array Logic ("PAL") devices. In CPLDs, configuration data is typically stored on-chip in non-volatile memory. In some CPLDs, configuration data is stored on-chip in non-volatile memory, then downloaded to volatile memory as part of an initial configuration (programming) sequence.

For all of these programmable logic devices ("PLDs"), the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other PLDs are programmed by applying a processing layer, such as a metal layer, that programmably interconnects the various elements on the device. These PLDs are known as mask programmable devices. PLDs can also be implemented in other ways, e.g., using fuse or antifuse technology. The terms "PLD" and "programmable logic device" include but are not limited to these exemplary devices, as well as encompassing devices that are only partially programmable. For example, one type of PLD includes a combination of hard-coded transistor logic and a programmable switch fabric that programmably interconnects the hard-coded transistor logic.

Figure 14:
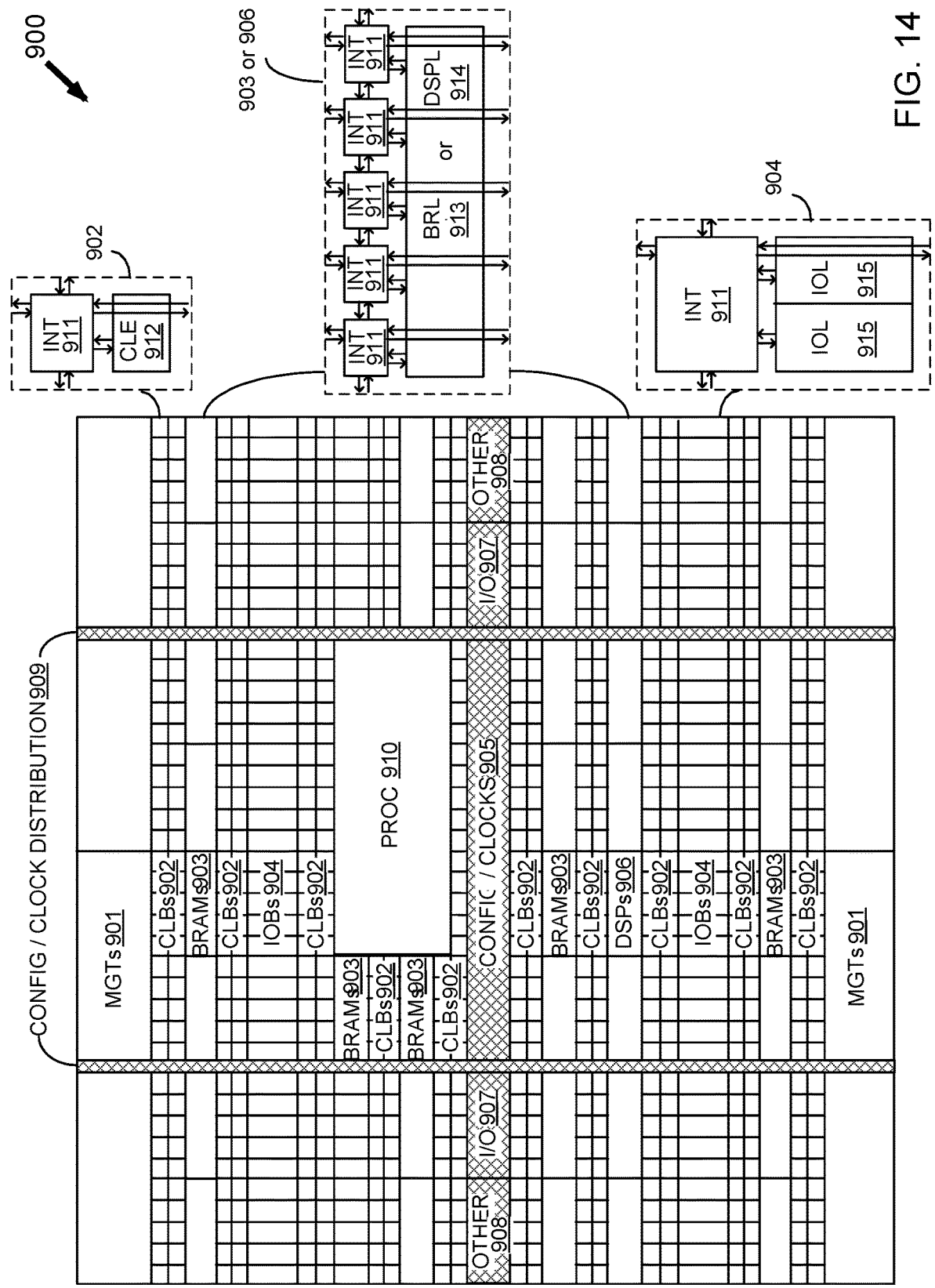
FIG. 14 is a simplified block diagram depicting an exemplary columnar Field Programmable Gate Array ("FPGA") architecture.

As noted above, advanced FPGAs can include several different types of programmable logic blocks in the array. For example, FIG. 14 illustrates an FPGA architecture 900 that includes a large number of different programmable tiles including multi-gigabit transceivers ("MGTs") 901, configurable logic blocks ("CLBs") 902, random access memory blocks ("BRAMs") 903, input/output blocks ("IOBs") 904, configuration and clocking logic ("CONFIG/CLOCKS") 905, digital signal processing blocks ("DSPs") 906, specialized input/output blocks ("I/O") 907 (e.g., configuration ports and clock ports), and other programmable logic 908 such as digital clock managers, analog-to-digital converters, system monitoring logic, and so forth. Some FPGAs also include dedicated processor blocks ("PROC") 910.

In some FPGAs, each programmable tile includes a programmable interconnect element ("INT") 911 having standardized connections to and from a corresponding interconnect element in each adjacent tile. Therefore, the programmable interconnect elements taken together implement the programmable interconnect structure for the illustrated FPGA. The programmable interconnect element 911 also includes the connections to and from the programmable logic element within the same tile, as shown by the examples included at the top of FIG. 14.

For example, a CLB 902 can include a configurable logic element ("CLE") 912 that can be programmed to implement user logic plus a single programmable interconnect element ("INT") 911. A BRAM 903 can include a BRAM logic element ("BRL") 913 in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 906 can include a DSP logic element ("DSPL") 914 in addition to an appropriate number of programmable interconnect elements. An IOB 904 can include, for example, two instances of an input/output logic element ("IOL") 915 in addition to one instance of the programmable interconnect element 911. As will be clear to those of skill in the art, the actual I/O pads connected, for example, to the I/O logic element 915 typically are not confined to the area of the input/output logic element 915.

In the pictured embodiment, a horizontal area near the center of the die (shown in FIG. 14) is used for configuration, clock, and other control logic. Vertical columns 909 extending from this horizontal area or column are used to distribute the clocks and configuration signals across the breadth of the FPGA.

Some FPGAs utilizing the architecture illustrated in FIG. 14 include additional logic blocks that disrupt the regular columnar structure making up a large part of the FPGA. The additional logic blocks can be programmable blocks and/or dedicated logic. For example, processor block 910 spans several columns of CLBs and BRAMs.

Note that FIG. 14 is intended to illustrate only an exemplary FPGA architecture. For example, the numbers of logic blocks in a row, the relative width of the rows, the number and order of rows, the types of logic blocks included in the rows, the relative sizes of the logic blocks, and the interconnect/logic implementations included at the top of FIG. 14 are purely exemplary. For example, in an actual FPGA more than one adjacent row of CLBs is typically included wherever the CLBs appear, to facilitate the efficient implementation of user logic, but the number of adjacent CLB rows varies with the overall size of the FPGA.

Figure 15:
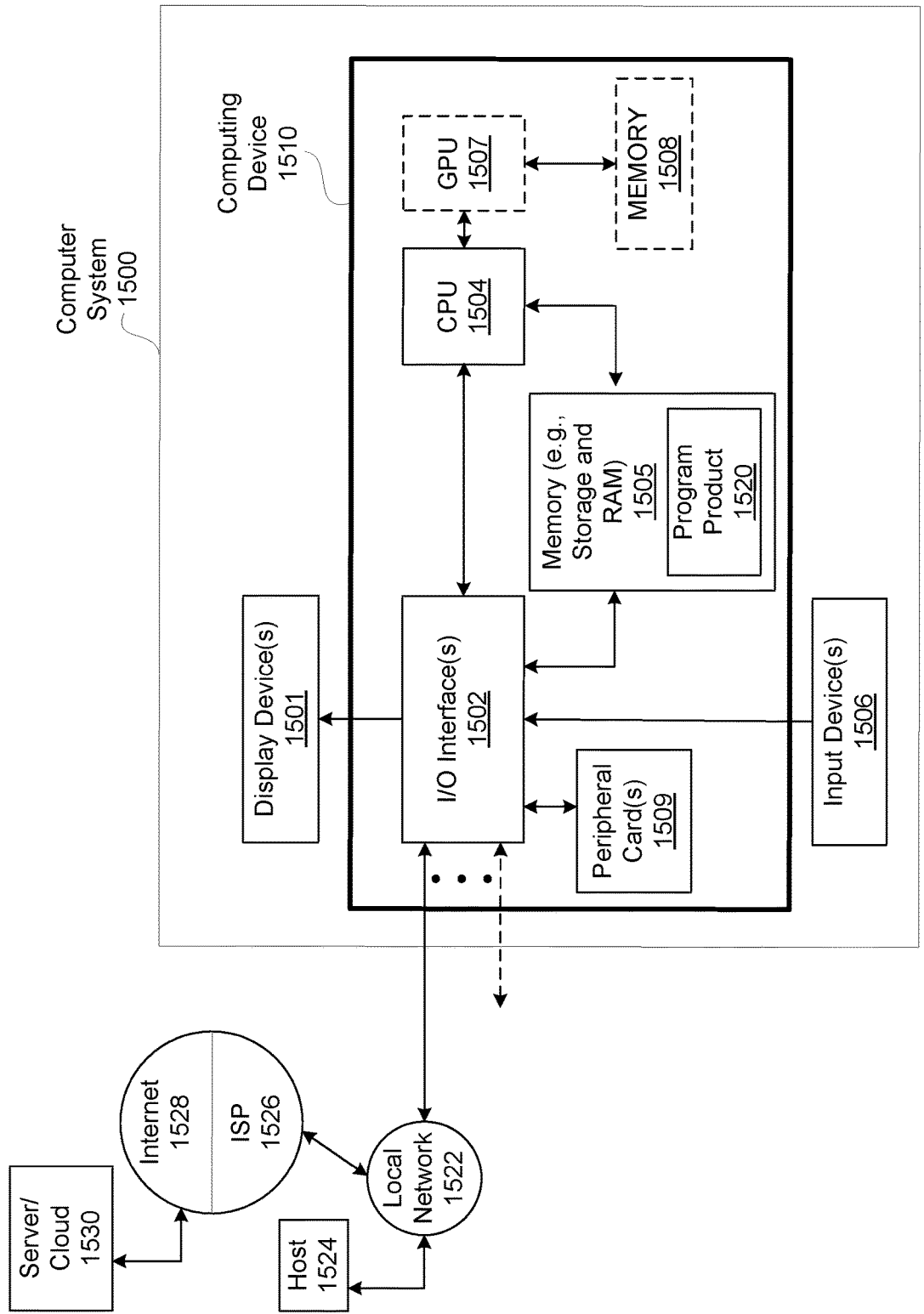
FIG. 15 is a block diagram depicting an exemplary computer system upon which one or more aspects described herein may be implemented.

FIG. 15 is a block diagram depicting an exemplary computer system 1500 upon which one or more aspects described herein may be implemented. Computer system 1500 may include a programmed computing device 1510 coupled to one or more display devices 1501, such as Cathode Ray Tube ("CRT") displays, plasma displays, Liquid Crystal Displays ("LCDs"), Light Emitting Diode ("LED") displays, light emitting polymer display ("LPDs") projectors and to one or more input devices 1506, such as a keyboard and a cursor pointing device. Other known configurations of a computer system may be used. Computer system 1500 by itself or networked with one or more other computer systems 1500 may provide an information handling system.

Programmed computing device 1510 may be programmed with a suitable operating system, which may include Mac OS, Java Virtual Machine, Real-Time OS Linux, Solaris, iOS, Darwin, Android Linux-based OS, Linux, OS-X, Unix, or a Windows operating system, among other platforms, including without limitation an embedded operating system, such as VxWorks. Programmed computing device 1510 includes a central processing unit ("CPU") 1504, one or more memories and/or storage devices ("memory") 1505, and one or more input/output ("I/O") interfaces ("I/O interface") 1502. Programmed computing device 1510 may optionally include a graphics processing unit ("GPU") 1507 coupled to CPU 1504 and to one or more peripheral cards 1509 coupled to I/O interface 1502. Along those lines, programmed computing device 1510 may include graphics memory 1508 coupled to optional GPU 1507.

CPU 1504 may be a type of microprocessor known in the art, such as available from IBM, Intel, ARM, and Advanced Micro Devices for example. CPU 1504 may include one or more processing cores. Support circuits (not shown) may include busses, cache, power supplies, clock circuits, data registers, and the like.

Memory 1505 may be directly coupled to CPU 1504 or coupled through I/O interface 1502. At least a portion of an operating system may be disposed in memory 1505. Memory 1505 may include one or more of the following: flash memory, random access memory, read only memory, magneto-resistive read/write memory, optical read/write memory, cache memory, magnetic read/write memory, and the like, as well as non-transitory media as described below. For example, memory 1505 may include an SSD, which is coupled to I/O interface 1502, such as through an SATA bus or other bus. Moreover, one or more SSDs may be used, such as for RAID or other multiple drive storage for example.

I/O interface 1502 may include chip set chips, graphics processors, and/or daughter cards, among other known circuits. In this example, I/O interface 1502 may be a Platform Controller Hub ("PCH"). I/O interface 1502 may be coupled to a conventional keyboard, network, mouse, camera, microphone, display printer, and interface circuitry adapted to receive and transmit data, such as data files and the like.

Programmed computing device 1510 may optionally include one or more peripheral cards 1509. An example of a daughter or peripheral card may include a network interface card ("NIC"), a display interface card, a modem card, and a Universal Serial Bus ("USB") interface card, among other known circuits. Optionally, one or more of these peripherals may be incorporated into a motherboard hosting CPU 1504 and I/O interface 1502. Along those lines, GPU 1507 may be incorporated into CPU 1504 and/or may be of a separate peripheral card.

Programmed computing device 1510 may be coupled to a number of client computers, server computers, or any combination thereof via a conventional network infrastructure, such as a company's Intranet and/or the Internet, for example, allowing distributed use. Moreover, a storage device, such as an SSD for example, may be directly coupled to such a network as a network drive, without having to be directly internally or externally coupled to programmed computing device 1510. However, for purposes of clarity and not limitation, it shall be assumed that an SSD is housed in programmed computing device 1510.

Memory 1505 may store all or portions of one or more programs or data, including variables or intermediate information during execution of instructions by CPU 1504, to implement processes in accordance with one or more embodiments hereof to provide program product 1520. Program product 1520 may be for implementing portions of process flows, as described herein. Additionally, those skilled in the art will appreciate that one or more embodiments hereof may be implemented in hardware, software, or a combination of hardware and software. Such implementations may include a number of processors or processor cores independently executing various programs, dedicated hardware and/or programmable hardware.

Along those lines, implementations related to use of computing device 1510 for implementing techniques described herein may be performed by computing device 1510 in response to CPU 1504 executing one or more sequences of one or more instructions contained in main memory of memory 1505. Such instructions may be read into such main memory from another machine-readable medium, such as a storage device of memory 1505. Execution of the sequences of instructions contained in main memory may cause CPU 1504 to perform one or more process steps described herein. In alternative implementations, hardwired circuitry may be used in place of or in combination with software instructions for such implementations. Thus, the example implementations described herein should not be considered limited to any specific combination of hardware circuitry and software, unless otherwise expressly stated herein.

One or more program(s) of program product 1520, as well as documents thereof, may define functions of embodiments hereof and can be contained on a variety of non-transitory tangible media, such as computer- or machine-readable media having code, which include, but are not limited to: (i) information permanently stored on non-writable storage media (e.g., read-only memory devices within a computer such as CD-ROM or DVD-ROM disks readable by a CD-ROM drive or a DVD drive); or (ii) alterable information stored on writable storage media (e.g., floppy disks within a diskette drive or flash drive or hard-disk drive or read/writable CD or read/writable DVD).

Computer readable storage media encoded with program code may be packaged with a compatible device or provided separately from other devices. In addition program code may be encoded and transmitted via wired optical, and/or wireless networks conforming to a variety of protocols, including the Internet, thereby allowing distribution, e.g., via Internet download. In implementations, information downloaded from the Internet and other networks may be used to provide program product 1520. Such transitory tangible media, when carrying computer-readable instructions that direct functions hereof, represent implementations hereof.

Along those lines the term "tangible machine-readable medium" or "tangible computer-readable storage" or the like refers to any tangible medium that participates in providing data that causes a machine to operate in a specific manner. In an embodiment implemented using computer system 1500, tangible machine-readable media are involved, for example, in providing instructions to CPU 1504 for execution as part of programmed product 1520. Thus, a programmed computing device 1510 may include programmed product 1520 embodied in a tangible machine-readable medium. Such a medium may take many forms, including those describe above.

The term "transmission media", which includes coaxial cables, conductive wire and fiber optics, including traces or wires of a bus, may be used in communication of signals, including a carrier wave or any other transmission medium from which a computer can read. Transmission media can also take the form of acoustic or light waves, such as those generated during radio-wave and infra-red data communications.

Various forms of tangible machine-readable media may be involved in carrying one or more sequences of one or more instructions to CPU 1504 for execution. For example, instructions may initially be carried on a magnetic disk or other storage media of a remote computer. The remote computer can load the instructions into its dynamic memory and send such instructions over a transmission media using a modem. A modem local to computer system 1500 can receive such instructions on such transmission media and use an infra-red transmitter to convert such instructions to an infra-red signal. An infra-red detector can receive such instructions carried in such infra-red signal and appropriate circuitry can place such instructions on a bus of computing device 1510 for writing into main memory, from which CPU 1504 can retrieve and execute such instructions. Instructions received by main memory may optionally be stored on a storage device either before or after execution by CPU 1504.

Computer system 1500 may include a communication interface as part of I/O interface 1502 coupled to a bus of computing device 1510. Such a communication interface may provide a two-way data communication coupling to a network link connected to a local network 1522. For example, such a communication interface may be a local area network ("LAN") card to provide a data communication connection to a compatible LAN. Wireless links may also be implemented. In any such implementation, a communication interface sends and receives electrical, electromagnetic or optical signals that carry digital and/or analog data and instructions in streams representing various types of information.

A network link to local network 1522 may provide data communication through one or more networks to other data devices. For example, a network link may provide a connection through local network 1522 to a host computer 1524 or to data equipment operated by an Internet Service Provider ("ISP") 1526 or other Internet service provider. ISP 1526 may in turn provide data communication services through a world-wide packet data communication network, the "Internet" 1528. Local network 1522 and the Internet 1528 may both use electrical, electromagnetic or optical signals that carry analog and/or digital data streams. Data carrying signals through various networks, which carry data to and from computer system 1500, are exemplary forms of carrier waves for transporting information.

Wireless circuitry of I/O interface 1502 may be used to send and receive information over a wireless link or network to one or more other devices' conventional circuitry such as an antenna system, an RF transceiver, one or more amplifiers, a tuner, one or more oscillators, a digital signal processor, a CODEC chipset, memory, and the like. In some implementations, wireless circuitry may be capable of establishing and maintaining communications with other devices using one or more communication protocols, including time division multiple access (TDMA), code division multiple access (CDMA), global system for mobile communications (GSM), Enhanced Data GSM Environment (EDGE), wideband code division multiple access (W-CDMA), Long Term Evolution (LTE), LTE-Advanced, WiFi (such as IEEE 802.11a, IEEE 802.11b, IEEE 802.11g and/or IEEE 802.11n), Bluetooth, Wi-MAX, voice over Internet Protocol (VoIP), near field communication protocol (NFC), a protocol for email, instant messaging, and/or a short message service (SMS), or any other suitable communication protocol. A computing device can include wireless circuitry that can communicate over several different types of wireless networks depending on the range required for the communication. For example, a short-range wireless transceiver (e.g., Bluetooth), a medium-range wireless transceiver (e.g., WiFi), and/or a long range wireless transceiver (e.g., GSM/GPRS, UMTS, CDMA, EV-DO, and LTE/LTE-Advanced) can be used depending on the type of communication or the range of the communication.

Computer system 1500 can send messages and receive data, including program code, through network(s) via a network link and communication interface of I/O interface 1502. In the Internet example, a server 1530 might transmit a requested code for an application program through Internet 1528, ISP 1526, local network 1522 and I/O interface 1502. Received code may be executed by processor 1504 as it is received, and/or stored in a storage device, or other non-volatile storage, of memory 1505 for later execution. In this manner, computer system 1500 may obtain application code in the form of a carrier wave.

While the foregoing describes exemplary apparatus(es) and/or method(s), other and further examples in accordance with the one or more aspects described herein may be devised without departing from the scope hereof, which is determined by the claims that follow and equivalents thereof. Claims listing steps do not imply any order of the steps. Trademarks are the property of their respective owners.

What is claimed is:

1. A method for comparison of a behavioral model of a communications system and a circuit realization of the communications system, comprising:
   simulating, using the behavioral model on a computing device, operation of the communications system to obtain a simulated pulse response;
   the simulating including:
      first equalizing first data with a first equalizer on a receiver side of a serializer-deserializer (SerDes) link of the behavioral model; and
      obtaining the simulated pulse response after the first equalizing;
   operating the circuit realization of the communications system to obtain a hardware pulse response, wherein the circuit realization of the communication system is a SerDes communication systems and each component of the circuit realization corresponds to a component of the behavioral model;
   the operating including:
      second equalizing second data corresponding to the first data with a second equalizer on a receiver side of a SerDes link of the circuit realization; and
      obtaining the hardware pulse response after the second equalizing;
   loading the hardware pulse response from the circuit realization to memory of the computing device;
   loading the simulated pulse response to the memory of the computing device;
   comparing the simulated pulse response of the SerDes Link of the behavioral model and the hardware pulse response of the SerDes Link of the circuit realization with one another by the computing device; and
   storing results from the comparing for adjustment of the behavioral model.

2. The method according to claim 1, wherein the behavioral model includes an Input/Output Buffer Information Specification-Algorithmic Modeling Interface ("IBIS-AMI") model for each of a transmitter, a communication link and a receiver of the communications system.

3. The method according to claim 1, wherein the first equalizer and the second equalizer respectively are a decision-feedback equalization model of the behavioral model and a decision-feedback equalization circuit of the circuit realization.

4. The method according to claim 1, wherein the simulating and the operating are performed in parallel for performing the comparing in real time.

5. The method according to claim 1, further comprising:
   performing the simulating and the operating for combinations of different voltages and temperatures associated with boundary conditions of the communications system to obtain the simulated pulse response and the hardware pulse response for each of the combinations;
   the comparing of the simulated pulse response and the hardware pulse response being for each of the combinations;
   obtaining the results for the combinations from the comparing; and
   adjusting settings of the behavioral model to enhance correlation with the circuit realization responsive to the results obtained for the combinations from the comparing.

6. The method according to claim 1, wherein the first equalizing and the second equalizing are respective decision feedback equalizations.

7. The method according to claim 6, wherein the first equalizing and the second equalizing each comprise unweighting the decision feedback equalizations.

8. The method according to claim 1, wherein the simulated pulse response is for a simulated pulse response distribution, and the hardware pulse response is for a hardware pulse response distribution.

9. The method according to claim 1, further comprising:
   performing the simulating and the operating for combinations of different settings for a transmitter model of the behavioral model and for a transmitter circuit of the circuit realization; and
   adjusting auto-adaptive settings of the behavioral model to enhance correlation with the circuit realization.

10. A system for comparison of a behavioral model of a communications system and a circuit realization of the communications system, comprising:
    the communications system modelled with the behavioral model being on a computing device;
    a first equalizer on a receiver side of a serializer-deserializer (SerDes) link of the behavioral model, the first equalizer being configured for first equalization of first data to obtain a simulated pulse response;
    the circuit realization being communicatively coupled with the computing device, wherein the circuit realization of the communication system is a SerDes communication systems and each component of the circuit realization corresponds to a component of the behavioral model;
    a second equalizer on a receiver side of a SerDes link of the circuit realization, the second equalizer being configured for second equalization of second data corresponding to the first data to obtain a hardware pulse response; and
    the computing device configured to receive the hardware pulse response from the circuit realization and to compare the simulated pulse response of the SerDes Link of the behavioral model and the hardware pulse response of the SerDes Link of the circuit realization with one another.

11. The system according to claim 10, wherein the behavioral model includes an Input/Output Buffer Information Specification-Algorithmic Modeling Interface ("IBIS-AMI") model for each of a transmitter, a communication link and a receiver of the communications system.

12. The system according to claim 10, wherein the first equalizer and the second equalizer respectively are a decision-feedback equalization model of the behavioral model and a decision-feedback equalization circuit of the circuit realization.

13. The system according to claim 10, wherein the computing device is configured to receive in tandem the simulated pulse response and the hardware pulse response for comparison in real time.

14. The system according to claim 10, wherein the behavioral model and the circuit realization are configured for using combinations of different voltages and temperatures associated with boundary conditions of the communications system to obtain the simulated pulse response and the hardware pulse response for each of the combinations.

15. The system according to claim 14, wherein the computing device is programmed to correlate the simulated pulse response and the hardware pulse response for each of the combinations.

16. The system according to claim 10, wherein the first equalizer and the second equalizer are respective decision feedback equalizers.

17. The system according to claim 16, wherein the first equalizer and the second equalizer are configured to unweight decision feedback equalizations for the first equalization and the second equalization.

18. A non-transitory computer readable storage medium storing one or more programs, the one or more programs comprising instructions, which when executed by a computing device with one or more processors and memory, cause the computing device to:

simulate operation of a communications system modelled with a behavioral model to obtain a simulated pulse response, wherein simulating operation of the communications system includes first equalization, by an equalizer model of the behavioral model, of first data received on a receiver side of a serializer-deserializer (SerDes) link of the behavioral model to obtain the simulated pulse response after the first equalization;

obtain a hardware pulse response associated with a second equalization of second data, the second equalization being on a receiver side of a SerDes link of a circuit realization of the communications system, the second data corresponding to the first data, wherein the circuit realization of the communication system is a SerDes communication systems and each component of the circuit realization corresponds to a component of the behavioral model; and compare the simulated pulse response of the SerDes Link of the behavioral model and the hardware pulse response of the SerDes Link of the circuit realization with one another.

19. The non-transitory computer readable storage medium according to claim 18, wherein the one or more programs comprising the instructions cause the computing device to load the simulated pulse response and the hardware pulse response in tandem for comparison of the simulated pulse response and the hardware pulse response with one another during real time parallel operation of the simulated operation and actual operation of the circuit realization.

20. The non-transitory computer readable storage medium according to claim 18, wherein the one or more programs comprising the instructions cause the computing device to perform the simulating for combinations of different voltages and temperatures associated with boundary conditions of the communications system to obtain the simulated pulse response for each of the combinations for correlation with the hardware pulse response for each of the combinations.

* * * * *